(12) United States Patent
Nielson et al.

(10) Patent No.: US 8,592,249 B1
(45) Date of Patent: Nov. 26, 2013

(54) PHOTOVOLTAIC SOLAR CELL

(71) Applicant: Sandia Corporation, Albuquerque, NM (US)

(72) Inventors: Gregory N. Nielson, Albuquerque, NM (US); Murat Okandan, Edgewood, NM (US); Jose Luis Cruz-Campa, Albuquerque, NM (US); Paul J. Resnick, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 13/707,875

(22) Filed: Dec. 7, 2012

Related U.S. Application Data

(60) Division of application No. 12/957,082, filed on Nov. 30, 2010, now Pat. No. 8,329,503, which is a continuation-in-part of application No. 11/933,458, filed on Nov. 1, 2007.

(51) Int. Cl.
*H01L 21/00* (2006.01)

(52) U.S. Cl.
USPC .................................. 438/98; 257/E27.125

(58) Field of Classification Search
None
See application file for complete search history.

(56) References Cited

U.S. PATENT DOCUMENTS

| | | | |
|---|---|---|---|
| 5,482,568 A | 1/1996 | Hockaday | |
| 5,501,893 A | 3/1996 | Laermer et al. | |
| 6,612,705 B1 | 9/2003 | Davidson et al. | |
| 6,624,548 B1 | 9/2003 | Miller et al. | |
| 6,957,894 B2 | 10/2005 | Rabinowitz et al. | |
| 6,964,486 B2 | 11/2005 | Rabinowitz | |
| 6,987,604 B2 | 1/2006 | Rabinowitz et al. | |
| 6,988,809 B2 | 1/2006 | Rabinowitz | |
| 7,077,361 B1 | 7/2006 | Rabinowitz | |
| 7,172,789 B2 | 2/2007 | Smith et al. | |
| 7,244,326 B2 | 7/2007 | Craig et al. | |
| 7,251,882 B2 | 8/2007 | Ricks et al. | |

OTHER PUBLICATIONS

R. A. Sinton et al, "Silicon Point Contact Concentrator Solar Cells", IEEE Electron Device Letters, vol. EDL-6, No. 8, Aug. 1985, pp. 405-407.

R. A. Sinton et al, "Design Criteria for Si Point-Contact Concentrator Solar Cells", IEEE Transactions on Electron Devices, vol. ED-34, No. 10, Oct. 19887, pp. 2116-2123.

Uthara Srinivasan et al., "Microstructure to Substrate Self-Assembly Using Capillary Forces," Journal of Microelectromechanical Systems, vol. 10, No. 1, , Mar. 2001, pp. 17-24.

*Primary Examiner* — Seahvosh Nikmanesh
(74) *Attorney, Agent, or Firm* — Olivia J. Tsai; John P. Hohimer

(57) ABSTRACT

A photovoltaic solar cell for generating electricity from sunlight is disclosed. The photovoltaic solar cell comprises a plurality of spaced-apart point contact junctions formed in a semiconductor body to receive the sunlight and generate the electricity therefrom, the plurality of spaced-apart point contact junctions having a first plurality of regions having a first doping type and a second plurality of regions having a second doping type. In addition, the photovoltaic solar cell comprises a first electrical contact electrically connected to each of the first plurality of regions and a second electrical contact electrically connected to each of the second plurality of regions, as well as a passivation layer covering major surfaces and sidewalls of the photovoltaic solar cell.

5 Claims, 12 Drawing Sheets

FIG. 11

PHOTOVOLTAIC SOLAR CELL

CROSS-REFERENCE TO RELATED APPLICATION

This is a divisional application of U.S. patent application Ser. No. 12/957,082 filed Nov. 30, 2010, issued on Dec. 11, 2012 as U.S. Pat. No. 8,329,503, which is a continuation-in-part of U.S. patent application Ser. No. 11/933,458 filed Nov. 1, 2007, which is pending. The entireties of these applications are incorporated herein by reference.

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to the generation of electricity from sunlight, and in particular to photovoltaic solar concentrators formed using lenses to concentrate sunlight onto transverse-junction photovoltaic solar cells.

BACKGROUND OF THE INVENTION

The adoption of photovoltaics for generating electricity from sunlight is largely driven by cost considerations. At present, photovoltaic systems are not competitive with fossil-fuel generated electricity. Thus, there is a need to reduce the overall photovoltaic system cost. This entails reducing the cost of photovoltaic modules as well as module assembly costs.

The present invention addresses this need with a photovoltaic solar concentrator which utilizes thin, small-area photovoltaic solar cells which can be batch fabricated and assembled onto a low-cost stainless steel or polymer substrate using fluidic self-assembly technology. Sunlight can be concentrated onto the photovoltaic solar concentrator to generate electricity using a moveable lens assembly which utilizes relatively small displacements on the order of millimeters or less to track the sun and thereby increase the efficiency of electrical generation.

These and other advantages of the present invention will become evident to those skilled in the art.

SUMMARY OF THE INVENTION

The present invention relates to a photovoltaic solar concentrator for generating electricity from sunlight. The photovoltaic solar concentrator comprises a substrate which can be made of stainless steel or an ultraviolet(uv)-stabilized polymer. One or more photovoltaic solar cells are located on the substrate; and a lens is located above each photovoltaic solar cell to concentrate the sunlight onto that photovoltaic solar cell. A plurality of piezoelectric actuators are provided on the substrate to move each lens to maintain the sunlight concentrated onto each photovoltaic solar cell over time as the sun moves during the course of a day, and from day to day. A feedback control circuit can also be provided on the substrate to receive an electrical input signal from at least one of the photovoltaic solar cells and to provide an electrical output signal to each piezoelectric actuator to move each lens to maintain the sunlight concentrated onto each photovoltaic solar cell.

Each photovoltaic solar cell generally comprises a plurality of spaced-apart transverse junctions, with a light-absorbing region formed of monocrystalline silicon (e.g. comprising {111}-oriented silicon or a part of a silicon-on-insulator substrate). Alternately, each photovoltaic solar cell can comprise a light-absorbing region formed of a III-V compound semiconductor, or germanium. In some cases, multiple photovoltaic solar cells can be stacked one upon the other to provide a multi-junction photovoltaic solar cell which comprises a plurality of vertically-stacked light-absorbing regions, with each light-absorbing region absorbing the sunlight over a different wavelength range.

In certain embodiments of the present invention, the plurality of piezoelectric actuators can operate to tilt each lens in order to maintain the sunlight concentrated onto the photovoltaic solar cell. In other embodiments of the present invention, the plurality of piezoelectric actuators can operate to laterally translate each lens in order to maintain the sunlight concentrated onto the photovoltaic solar cell. Each piezoelectric actuator can also be operatively connected through a displacement-multiplier linkage to provide an increased displacement to move each lens.

The present invention also relates to a photovoltaic solar concentrator for generating electricity from sunlight which comprises a plurality of substrates stacked one upon the other and moveable in a vertical direction relative to each other by at least one piezoelectric actuator sandwiched between each adjacent pair of the substrates. A plurality of tilt plates are arranged side-by-side and are supported above the plurality of substrates, with each tilt plate being supported on a plurality of legs (e.g. three legs) which are operatively connected to the plurality of substrates to tilt each tilt plate in response to movement of the plurality of substrates relative to each other in the vertical direction. A lens is supported on each tilt plate to concentrate the sunlight onto a photovoltaic solar cell which is located beneath the lens on one of the plurality of substrates, with the lens being tiltable to maintain the sunlight concentrated onto the photovoltaic solar cell over time in response a tilting of the plurality of tilt plates produced by the piezoelectric actuator(s) which move the plurality of substrates relative to each other in the vertical direction. Each photovoltaic solar cell can comprise a plurality of spaced-apart transverse junctions, and can include a monocrystalline silicon light-absorbing region. In some embodiments of the present invention, each lens in the photovoltaic solar concentrator can be formed with a tapered sidewall, and with a light-reflective coating deposited on the tapered sidewall.

The photovoltaic solar concentrator can further comprise a feedback control circuit to receive an electrical input signal from one or more of the photovoltaic solar cells and use this input signal to generate an electrical output signal to drive the each piezoelectric actuator to vertically move the plurality of substrates relative to each other in the vertical direction. The feedback control circuit can be located on one of the plurality of substrates (e.g. on the same substrate containing the photovoltaic solar cells, or on a different substrate).

The photovoltaic solar concentrator can further comprise a truss located between the plurality of substrates and the plurality of tilt plates, with one of the plurality of legs supporting each tilt plate being connected to the truss, and with the truss being connected to one of the plurality of substrates. The truss and the plurality of tilt plates can comprise an ultraviolet-stabilized polymer.

The present invention further relates to a photovoltaic solar concentrator for generating electricity from sunlight which comprises a first substrate having a plurality of photovoltaic solar cells arrayed thereon. Each photovoltaic solar cell can comprise a plurality of spaced-apart transverse junctions. A truss is supported above the first substrate and attached thereto, with the truss having an opening therethrough at a location above each photovoltaic solar cell. A tilt plate is centered above each opening in the truss, with the tilt plate being supported by a plurality of legs and holding a lens to concentrate the sunlight onto the photovoltaic solar cell located therebeneath, and with a first leg of the plurality of legs being connected between the tilt plate and the truss. A second substrate is located below the first substrate, with each tilt plate being connected to the second substrate by a second leg of the plurality of legs. A third substrate is located below the second substrate, with each tilt plate being connected to the third substrate by a third leg of the plurality of legs. A plurality of piezoelectric actuators are sandwiched between each adjacent pair of the substrates to provide a vertical movement between each adjacent pair of the substrates, with the vertical movement tilting each lens in unison to maintain the sunlight concentrated onto each photovoltaic solar cell over time. The photovoltaic solar concentrator can further comprise a feedback control circuit to receive an electrical input signal from one or more of the photovoltaic solar cells and use this input signal to provide an electrical output signal to drive each piezoelectric actuator.

Each lens in the photovoltaic solar concentrator can comprise an ultraviolet-stabilized polymer. Each lens can also have a tapered sidewall with a light-reflective coating deposited thereon.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings:

FIG. 11 shows a schematic cross-section view (along the section line 1-1 in FIG. 2A) to illustrate fabrication of the transverse-junction photovoltaic solar cell of FIG. 2A on an SOI wafer.

DETAILED DESCRIPTION OF THE INVENTION

Figure 1:
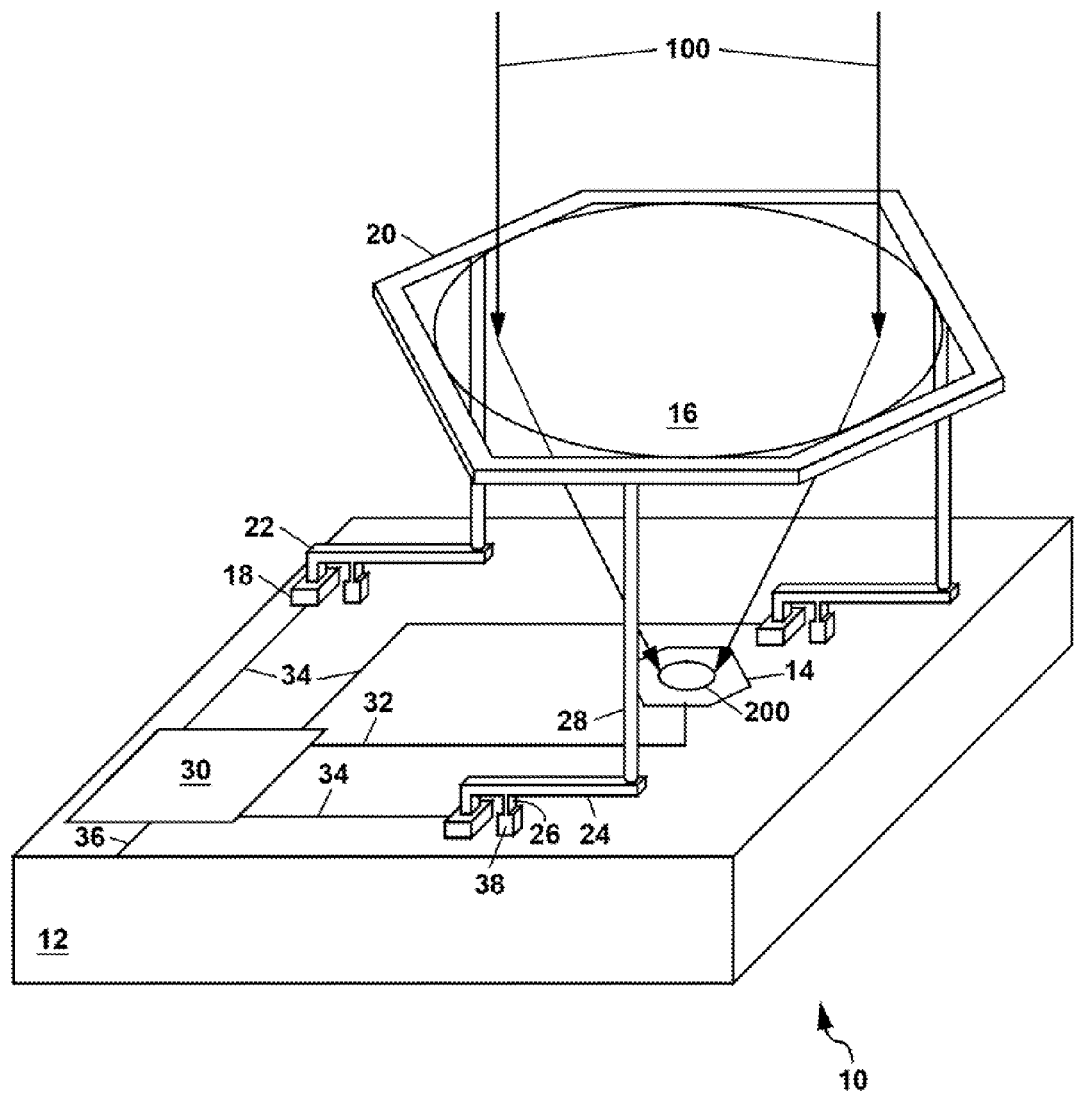
FIG. 1 shows a schematic perspective view of a first example of the photovoltaic solar concentrator of the present invention.

Referring to FIG. 1, there is shown a schematic perspective view of a first example of a photovoltaic solar concentrator 10 according to the present invention. The photovoltaic solar concentrator 10 comprises a substrate 12 whereon one or more photovoltaic solar cells 14 (also termed solar cells) are located. A lens 16 is positioned above each photovoltaic solar cell 14 to receive sunlight 100 and concentrate the sunlight 100 into a focused spot 200 on the underlying photovoltaic solar cell 14. The sunlight 100 can be concentrated by a factor of 10-500 times or more, with the exact concentration of the sunlight 100 depending upon the relative sizes of the lens 16 and the solar cell 14 and a spacing therebetween which determines how tightly the sunlight 100 is focused onto the solar cell 14. In response to the concentrated sunlight 100 incident on the photovoltaic solar cell 14, electricity is generated in the solar cell 14. The electricity can be output from the solar cell 14 through electrical traces (i.e. wiring) on the substrate 12.

The substrate 12 can comprise, for example, a metal such as stainless steel, a polymer (e.g. a uv-stabilized polymer), a printed-circuit board, glass, ceramic, etc. When the substrate 12 is electrically conductive, an electrically-insulating film (not shown) can be provided over the substrate 12 with the electrical traces being formed on or within the electrically-insulating film. In certain embodiments of the present invention, the substrate 12 can further include a plurality of fluid channels formed through the substrate 12 to allow for active or passive cooling of the substrate 12 with a fluid. In other embodiments of the present invention, the substrate 12 can be attached to a finned heat sink, or can include a plurality of fins formed on a bottom side of the substrate 12 to dissipate heat generated by the sunlight 100 incident on each solar cell 14.

Over time as the sun moves across the sky during the course of a day, the spot 200 of the sunlight 100 will move across the face of the solar cell 14 and may even move completely off the solar cell 14. Additionally, although the movement of the sun in the course of a day follows an approximately straight-line path, this straight-line path moves from day to day as the angle of the sun changes from a maximum value at the summer solstice to a minimum value at the winter solstice. To remedy this situation and provide for tracking of the sunlight 100 to maximize the efficiency of the photovoltaic solar concentrator 10, the lens 16 must be tilted or laterally translated to keep the spot 200 of the sunlight 100 on the solar cell 14. In the example of FIG. 1, this can be done using a plurality of actuators 18 which move vertically (i.e. substantially perpendicular to the substrate 12) to tilt the lens 16 which can be mounted on a frame 20 (also referred to herein as a tilt plate). The actuators 18 are preferably piezoelectric actuators 18 since this type of actuator requires very little electrical power for operation. Each piezoelectric actuator 18 can be operatively connected through a displacement-multiplier linkage 22 to provide an increased movement of the frame 20 to tilt the lens 16 and thereby maintain the sunlight 100 concentrated onto the photovoltaic solar cell 14.

The displacement-multiplier linkage 22, which is schematically illustrated in FIG. 1, can comprise a lever arm 24 which is supported on a flexure 26 with a short end of the lever arm 24 being connected to the piezoelectric actuator 18, and with a long end of the lever arm 24 being connected to the frame 20 through a leg 28. The displacement-multiplier linkage 22 can magnify a displacement provided by each piezoelectric actuator 18 by a factor of up to 10-20 times or more depending upon the relative lengths of the short and long ends of the lever arm 24. The term "displacement-multiplier linkage" as used herein refers to a linkage which receives an input displacement at one end thereof and provides an output displacement at another end thereof in response to the input displacement, with the output displacement being larger than the input displacement.

The operation of each piezoelectric actuator 18 in the example of FIG. 1 can be controlled by a feedback control circuit 30 which can be located on the substrate 12. The feedback control circuit 30 receives an electrical input signal 32 from each solar cell 14 in the photovoltaic solar concentrator 10 through the wiring on the substrate 12. This electrical input signal can provide the electrical power for operating the feedback control circuit 30 which monitors the electrical output power generated by the solar cell 14 via the electrical input signal 32 and generates therefrom electrical output signals 34 to drive each piezoelectric actuator 18 to control the position of the lens 16 to maintain the sunlight 100 concentrated on the solar cell 14. Very little electrical power is required by the feedback control circuit 30 since the circuit 30 can be formed as a complimentary metal-oxide semiconductor (CMOS) integrated circuit (IC) and since the piezoelectric actuators 18 are voltage-operated devices which draw very little electrical current. Thus, the majority of the electrical power generated by the solar cell 14 can be directed through the feedback control circuit 30 to an electrical power output line 36 and therefrom off the substrate 12 via an external electrical connection.

Additional functionality can be optionally provided in the feedback control circuit 30. For example, the feedback control circuit 30 can include an inverter to step up the voltage of the input signal 32 from the solar cell(s) 14, as needed, to operate the feedback control circuit 30 and to provide the output signals 34 to drive the piezoelectric actuators 18. The inclusion of an inverter can also allow alternating-current (ac) electrical power to be generated by the photovoltaic solar concentrator 10 and provided to the output line 36.

As another example, the feedback control circuit 30 can control an operating point (i.e. an operating voltage and current) of the solar cell(s) 14 to maximize electrical power generation under particular illumination conditions. The operating point can be selected by the feedback control circuit 30 to be the voltage and current where the electrical power delivered to an external resistive load is maximized under given illumination conditions. Alternately, the feedback control circuit 30 can set the operating point of each solar cell 14 at a low voltage (e.g. near zero Volts) and a relatively high current since, under these conditions, a maximum number of photo-generated carriers in each solar cell 14 can be collected. This can be done, for example, by switching the electrical input signal 32 of one or more of the solar cells 14 between a pair of energy storage capacitors to alternately charge the energy storage capacitors. As the current provided by the solar cells 14 charges a first energy storage capacitor to a predetermined point, the solar cells 14 can be switched over to a second energy storage capacitor while the first energy storage capacitor is discharged into a much larger third energy storage capacitor. By cycling the solar cells 14 between the first and second energy storage capacitors and then dumping the charge from the first and second energy storage capacitors into the much larger third energy storage capacitor, each solar cell 14 can be operated at a low voltage to maximize its sunlight-to-electrical energy conversion efficiency.

Another way to operate each solar cell 14 at a low voltage to maximize its sunlight-to-electrical energy conversion efficiency is to locate the first and second energy storage capacitors in a feedback loop around an operational amplifier which operates as an integrator. In this arrangement, the first and second energy storage capacitors can be switched in and out of the feedback loop, with the first and second energy storage capacitors being charged up by the solar cells 14 while being connected in the feedback loop about the operational amplifier, and then being discharged into the much larger third energy storage capacitor while being disconnected from the feedback loop around the operational amplifier.

As yet another example of additional functionality which can be provided in the feedback control circuit 30, the feedback control circuit 30 can monitor and regulate the electrical power output generated by individual solar cells 14 in an array (see FIGS. 5-7) in order to optimize the total electrical output power and to electrically disconnect any of the solar cells 14 which may have a low electrical output power due, for example, to shading of the sunlight 100. If such shaded solar cells 14 were to remain connected in parallel or in series with other of the solar cells 14 which were not shaded, the shaded solar cells 14 could possibly be overdriven by the current and voltage produced by the unshaded solar cells 14; and this could possibly damage the shaded solar cells 14. The solar cells 14 could be monitored individually or in blocks and switched into or out of a parallel or series connection as needed to protect the shaded solar cells 14. The output power generated by the solar cells 14 individually or in blocks can also be monitored by the feedback control circuit 30 to provide information about the health of the solar cells 14 to reduce maintenance costs, or to indicate the presence of underperforming solar cells 14. To do this, the feedback control circuit 30 can include a microprocessor and memory, and can provide electrical output connections so that the feedback control circuit 30 can be connected to an external computer for readout or programming.

In the example of FIG. 1, the lens 16 can be either a diffractive lens (also termed a Fresnel lens), or a refractive lens. The lens 16 can be formed from a material such as glass, a polymer (e.g. a uv-stabilized polymer), silicon, calcium fluoride, etc. The lateral dimensions of the lens 16 in the example of FIG. 1 can be on the order of one centimeter or smaller. When an array of solar cells 14 is used for the photovoltaic solar concentrator 10, a plurality of lenses 16 can be provided with each lens 16 being used to concentrate the sunlight 100 onto a different solar cell 14 in the array (see FIGS. 5-7). In this case, the lenses 16 are preferably arranged to provide a relatively high fill factor which, in some cases, can approach 100%. An anti-reflection coating can be applied to one or both surfaces of each lens 16 to minimize the reflection of the sunlight 100 from the surfaces of the lens 16.

The term "uv-stabilized polymer" as used herein refers to a polymer having an added uv-stabilizing agent to make the polymer is resistant to degradation or decomposition when exposed to ultraviolet (uv) light from the sun. A uv-stabilized polymer is sometimes referred to as a uv-resistant polymer. Those skilled in the art will understand that there are many different commercially available uv-stabilized polymers which can be used for practice of the present invention. A common use for uv-stabilized polymers is for window glazing. For the lens 16, the uv-stabilized polymer should be transparent; whereas transparency of the uv-stabilized polymer is not required for the frame 20, displacement-multiplier linkages 22 and legs 28 unless these elements are molded together with the lens 16 as a single unit.

The frame 20, displacement-multiplier linkages 22 and legs 28 can also be formed from a polymer material (e.g. a uv-stabilized polymer). In some cases, the lens 16, frame 20 and displacement-multiplier linkages 22 can be formed as a molded unit. This can reduce cost and simplify assembly of the photovoltaic solar concentrator 10 by allowing the molded unit to be snapped onto the substrate 12. As an example, a base 38 for each displacement-multiplier linkage 22 can include a pin at the bottom thereof which snaps into an opening through the substrate 12 to attach the lens 16, frame 20 and linkage 22 to the substrate 12. Alternately, each base 38 can be attached to the substrate 12 with an adhesive (e.g. a polymer adhesive when the base 38 and the substrate 12 both comprise a polymer). An adhesive can also be used to secure a short end of the lever arm 24 to the underlying piezoelectric actuator 18 although, in some cases, this may not be needed.

When the lens 16 is formed from a different material than the frame 20 and the displacement-multiplier linkages 22, the frame 20 can be configured so that the lens 16 will snap into the frame 20 to simplify assembly. Alternately, the lens 16 can be attached to the frame 20 with an adhesive (e.g. an epoxy or polymer adhesive).

Figure 2A:
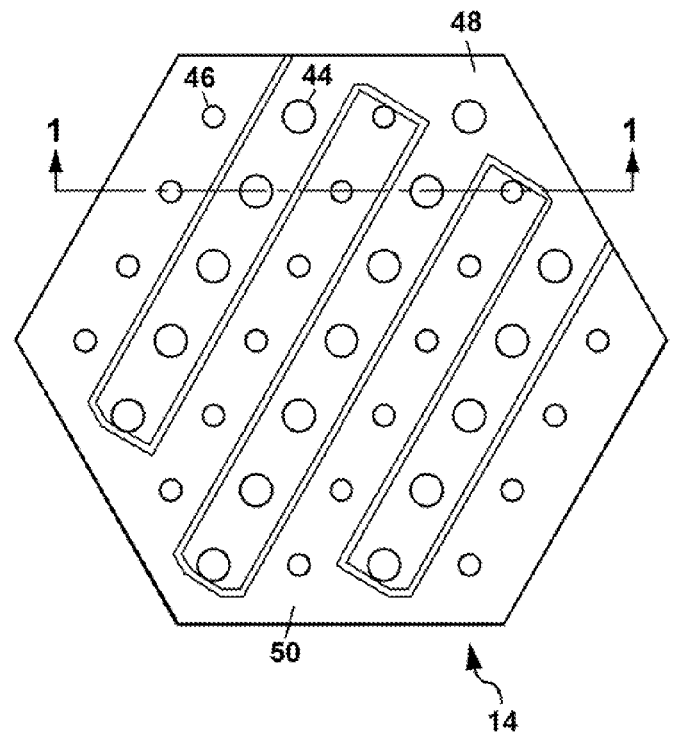
FIGS. 2A and 2B show, respectively, a schematic plan view and a schematic cross-section view (along the section line 1-1 in FIG. 2A) of a transverse-junction photovoltaic solar cell formed according to the present invention.
Figure 2B:
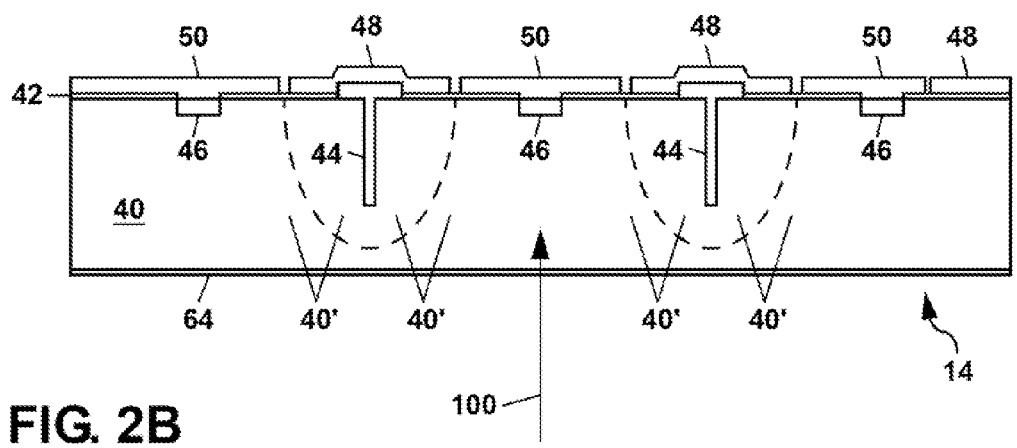

In the example of FIG. 1, the photovoltaic solar cell 14 will generally comprise a transverse-junction solar cell 14 (also referred to as a point contact solar cell) which is schematically illustrated in FIGS. 2A and 2B. In FIG. 2A, a bottom surface of the transverse-junction solar cell 14 is shown. FIG. 2B shows a schematic cross-section along the section line 1-1 in FIG. 2A.

The transverse-junction solar cell 14 comprises a plurality of spaced-apart transverse semiconductor junctions which comprise n-type-doped and p-type-doped regions formed in a semiconductor substrate 40 which can be lightly doped (e.g. to $10^{17}$ cm$^{-3}$ or less) with a p-type or an n-type impurity dopant. Alternately, the semiconductor substrate 40 can be intrinsic (i.e. not intentionally doped). Altogether, tens to hundreds of transverse semiconductor junctions can be located in the solar cell 14 which can have lateral dimensions of generally 0.1-1 millimeter, with adjacent transverse semiconductor junctions being separated by 20-50 μm.

Fabrication of the photovoltaic solar cell 14 will be described hereinafter for a solar cell 14 comprising silicon, although those skilled in the art will understand that the photovoltaic solar cell 14 can comprise other types of semiconductors known to the art including germanium and III-V compound semiconductors (e.g. gallium arsenide, indium phosphide, indium gallium arsenide, etc.).

The silicon substrate 40 can be initially prepared by forming a passivation layer 42 of silicon dioxide or silicon nitride over the major surfaces of the substrate 40. This can be done by a thermal oxidation process, or alternately by chemical vapor deposition (CVD). The passivation layer can be, for example, 100-200 nanometers thick.

A plurality of generally circular openings having a width of up to a few microns can then be etched through the passivation layer 42 and partway through the silicon substrate 40 to a depth of a few microns. This can be done by anisotropically etching the openings using a reactive ion etching step with a photolithographically-defined etch mask (not shown).

The openings can then be filled with polycrystalline silicon 44 (also termed polysilicon) having a doping type which is opposite the doping type of the silicon substrate 40 (e.g. n-type-doped when the substrate 40 is p-type-doped). The polysilicon 44, which can be deposited by CVD, fills in the openings and can extend overtop the silicon substrate 40. A reactive ion etching step using another photolithographically-defined etch mask can then be used to remove any excess polysilicon 44 to provide an exposed circular or polygonal top surface for the polysilicon 44 as shown FIGS. 2A and 2B.

An ion-implanted region 46 with a doping type the same as the silicon substrate 40 can be formed adjacent to each polysilicon region 44, with a dopant concentration in the ion-implanted region 46 being higher than that of the substrate 40 (e.g. p$^+$ doped when the substrate 40 is p-doped). Ions of boron or phosphorous can be implanted into the silicon substrate 40 to form the ion-implanted region 46 depending on whether the ion-implanted region 46 is p-type doped or n-type doped, respectively. The ion-implanted region 46 can extend down into the silicon substrate 40 for a distance of up to about 1 μm.

An electrical contact 48 can be deposited over the silicon substrate 40 to contact all of the polysilicon regions 44 in parallel. The electrical contact 48 can comprise aluminum, and can be shaped, for example, as shown in FIGS. 2A and 2B. Another electrical contact 50 can similarly contact all of the ion-implanted regions 46 in parallel. The electrical contacts 48 and 50 are electrically isolated from the silicon substrate 40 by the intervening passivation layer 42. Since both electrical contacts 48 and 50 are located on the same side of the solar cell 14 electrical connections to the solar cell 14 are made simpler. Also, the sunlight 100 entering the solar cell 14 is not shaded by the electrodes 48 and 50 since the sunlight 100 enters the solar cell 14 on a side opposite the contacts 48 and 50. Furthermore, the electrical contacts 48 and 50 act as mirrors to reflect any of the sunlight 100 that is not absorbed in a monocrystalline silicon light-absorbing region 40' (i.e. a portion 40' of the semiconductor substrate 40 between each adjacent pair of the electrodes 48 and 50) back through the light-absorbing region 40' a second time. This increases the efficiency of the transverse-junction solar cell 14 for generating electricity by increasing the amount of the sunlight 100 which is absorbed in the solar cell 14 to produce electrical charge carriers (i.e. electrons and holes) therein.

The completed solar cell 14 can be attached to the substrate 12 of the photovoltaic solar concentrator 10 using an adhesive (e.g. an electrically-conductive epoxy) or solder with the electrical contacts 48 and 50 being aligned with wiring on the substrate 12. In some embodiments of the present invention, electrical vias (not shown) can be formed through the semiconductor substrate 40 to contact pads on a surface of the semiconductor substrate 40 opposite the electrical contacts 48 and 50. The vias and contact pads can be located near the periphery of the solar cell 14 so that the sunlight 100 is not blocked from entering the light-absorbing regions 40' of the solar cell 14. The provision of electrical vias through the semiconductor substrate 40 to contact pads on a side of the substrate 40 opposite the contacts 48 and 50 is useful for making electrical connections to the solar cell 14 using wire bonds, or when the solar cell 14 is located in a recess in the substrate 12.

The concentrated sunlight 100 enters the solar cell 14 as shown in FIGS. 1 and 2B and is absorbed into the monocrystalline light-absorbing region 40' to produce electrical charge carriers (i.e. electrons and holes). A depletion region is formed about each polysilicon region 44 by a built-in electric field produced by the opposite doping of the regions 44 and 46 which form the transverse semiconductor junction. The dashed lines in FIG. 2B illustrate the extent of the depletion region, which extends outward from each polysilicon region 44, due to the built-in electric field without any applied bias and in the absence of any illumination. The photogenerated electrons and holes produced by the absorption of the sunlight 100 in the solar cell 14 are collected by the regions 44 and 46 to produce electricity which flows into the electrical contacts 48 and 50. Any of the sunlight 100 which is not absorbed during a first pass through the semiconductor substrate 40 is reflected off the electrical contacts 48 and 50 and passes back through the semiconductor substrate 40 for a second pass thereby increasing the efficiency of the solar cell 14. The solar cell 14 in FIGS. 2A and 2B can provide a sunlight-to-electrical energy conversion efficiency of up to about 30%. With multiple stacked solar cells 14 as will be described hereinafter, the efficiency can be even higher.

Generally a large number of photovoltaic solar cells 14 will be fabricated on a 4-12 inch wafer and then separated with each solar cell 14 having a polygonal shape (e.g. hexagonal or square) with lateral dimensions of, for example, up to about one millimeter. Each photovoltaic solar cell 14 can be made thin (e.g. ≤50 µm and preferably 5-10 µm) to mitigate against bulk Auger recombination which can occur when a density of photogenerated carriers is non-uniform over the thickness of the solar cell 14. Different methods are available according to the present invention to fabricate the photovoltaic solar cells 14 with a thickness which is less than 50 µm and preferably in the range of 5-10 µm depending on whether the solar cells 14 are to be fabricated from a silicon-on-insulator (SOI) wafer, or from a monocrystalline silicon wafer. These methods, which are schematically illustrated in the cross-section views of FIGS. 3A-3C and 4A-4D, can also be adapted to form solar cells 14 from germanium (e.g. using a germanium-on-insulator wafer, or a {111}-oriented germanium wafer).

Figure 3A:
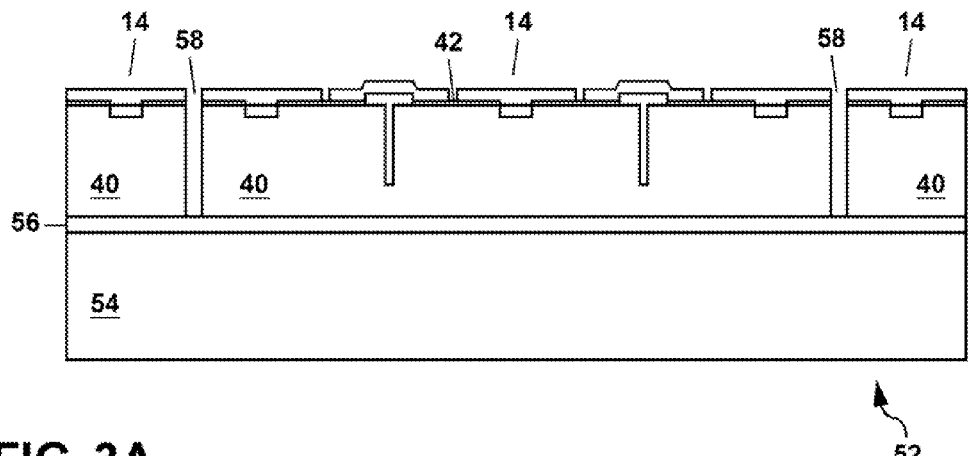
FIGS. 3A-3C show schematic cross-section views to illustrate fabrication of the transverse-junction photovoltaic solar cell of FIGS. 2A and 2B on a silicon-on-insulator (SOI) substrate.
Figure 3B:
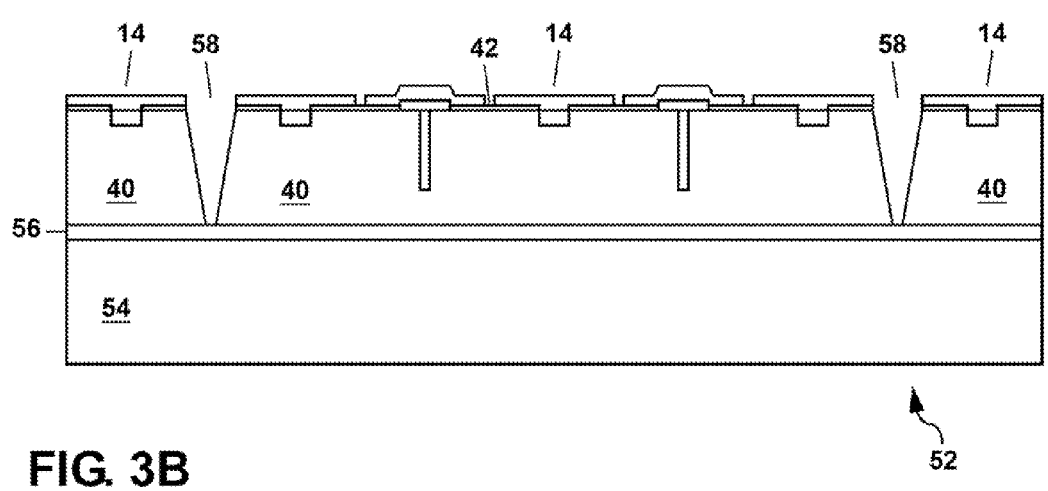
Figure 3C:
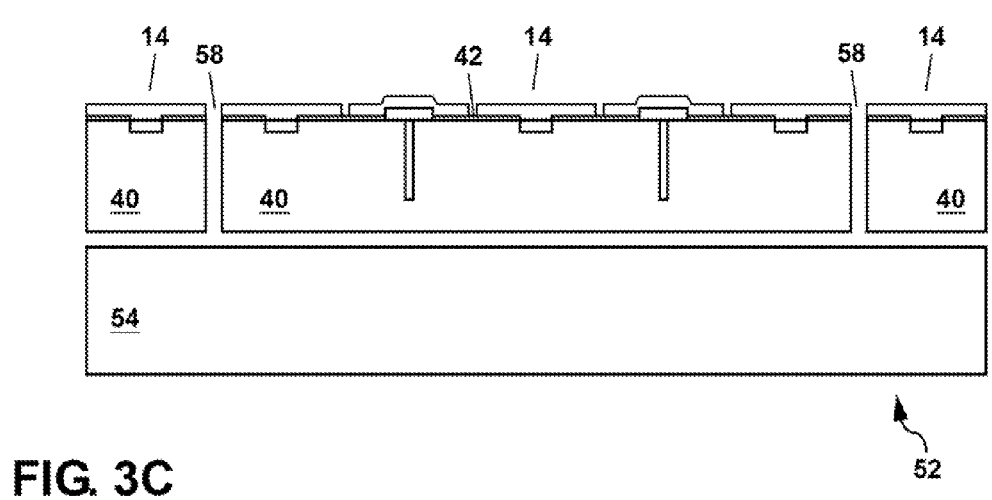

In a first method in FIGS. 3A-3C, the solar cells 14 are fabricated on a SOI wafer 52 which comprises a monocrystalline silicon layer which forms the silicon substrate 40 and a monocrystalline silicon body 54 sandwiched about a silicon dioxide layer 56 (also termed a buried oxide layer). The SOI wafer 52 can be procured commercially with the monocrystalline silicon layer being of the exact thickness (e.g. 5-50 µm) required for the silicon substrate 40. The monocrystalline silicon body 54 will generally be several hundred microns thick (e.g. 500 µm).

The solar cells 14 can be fabricated on an upper surface of the monocrystalline silicon layer as described previously with respect to FIGS. 2A and 2B, with a trench 58 being etched around each solar cell 14. To form the solar cells 14 with straight sidewalls, a reactive ion etching step can be used to form the trench 58 when the thickness of the monocrystalline silicon layer is less than about 10 µm. A deep reactive ion etching step as disclosed in U.S. Pat. No. 5,501,893 to Laermer can be used for etching the trench 58 to a depth more than 10 µm. Etching of the trench 58 with straight sidewalls is schematically illustrated in FIG. 3A.

Alternately, to form the solar cells 14 with sloping sidewalls, an anisotropic etching step can be performed using, for example, an anisotropic wet etchant such as potassium hydroxide (KOH), tetramethyl ammonium hydroxide (TMAH), ethylenediamine pyrocatechol (EDP). The anisotropic wet etchant terminates etching on {111} crystalline planes of silicon which for a {100}-oriented silicon substrate 40 will be oriented at an angle of 55° to the major surfaces of the substrate 40. This is schematically illustrated in FIG. 3B. Sloping sidewalls can be useful when the solar cells 14 are to be aligned and attached to the substrate 12 using a fluidic self-assembly process as will be discussed hereinafter.

In either case, the trench 58 exposes the underlying silicon dioxide layer 56 which can then be removed with an etching step using a selective wet etchant comprising hydrofluoric acid (HF). The HF etchant etches away the silicon dioxide layer 56 thereby undercutting the substrate 40 of each solar cell 14 and releasing the solar cell 14 from the remainder of the SOI wafer 52 as shown in FIG. 3C. The HF does not substantially etch other materials in the solar cell 14. An etch protection layer (not shown) can be provided overtop each solar cell 14 to protect a silicon dioxide passivation layer 42 during the selective etching step, or alternately the passivation layer can be formed from silicon nitride which is resistance to the HF etchant. This method can also be used with a germanium-on-insulator (GeOI) wafer when the solar cells 14 comprise germanium.

After the solar cells 14 have been removed from the monocrystalline silicon body 54, the monocrystalline silicon body 54 can be recycled to form another SOI wafer 52. This can reduce the cost of the solar cells 14.

Figure 4A:
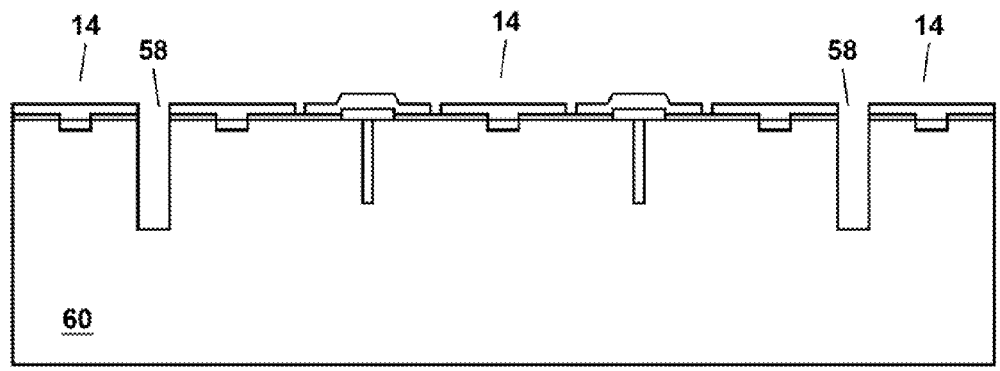
FIGS. 4A-4D show schematic cross-section views to illustrate fabrication of the transverse-junction photovoltaic solar cell of FIGS. 2A and 2B on a {111}-oriented monocrystalline silicon substrate.

The method of FIGS. 4A-4D can be used when the silicon substrate 40 comprises a part of a {111}-oriented monocrystalline silicon substrate 60 (i.e. a silicon substrate 60 in which the major surfaces are aligned along {111} crystalline planes). The {111}-oriented silicon substrate 60 can be up to several hundreds of microns thick. Fabrication of a plurality of solar cells 14 can be performed as previously described with reference to FIGS. 2A and 2B. The solar cells 14 can be covered with a protective film (not shown) such as silicon nitride, and then a trench 58 can be etched around each solar cell 14 as shown in FIG. 4A. The trench 58 can be etched with a reactive ion etching step when the silicon substrate 40 to be formed is up to about 10 µm thick, or with a deep reactive ion etching step as disclosed in U.S. Pat. No. 5,501,893, which is incorporated herein by reference, when the substrate 40 being formed is thicker than about 10 µm.

Figure 4B:
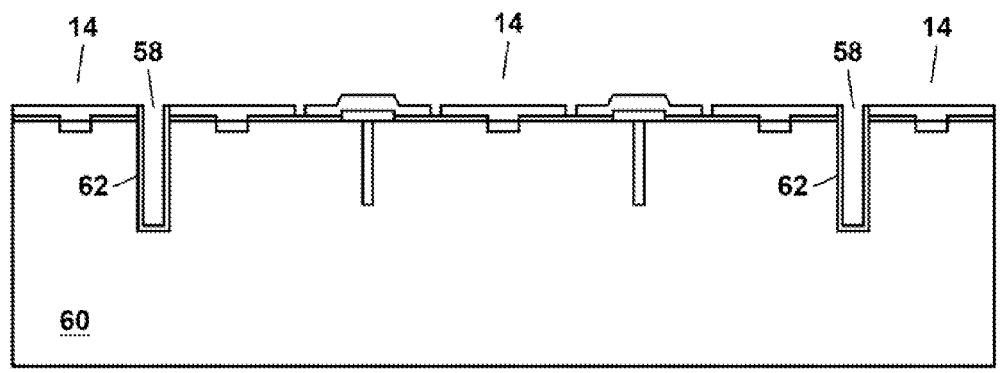

After etching the trench 58 about each solar cell 14 being formed, a conformal film 62 can be deposited to line each trench 58 as shown in FIG. 4B. The conformal film 62 can comprise about 100-200 nanometers thickness of silicon nitride deposited by CVD (e.g. by plasma-enhanced CVD at a temperature of about 400° C.).

Figure 4C:
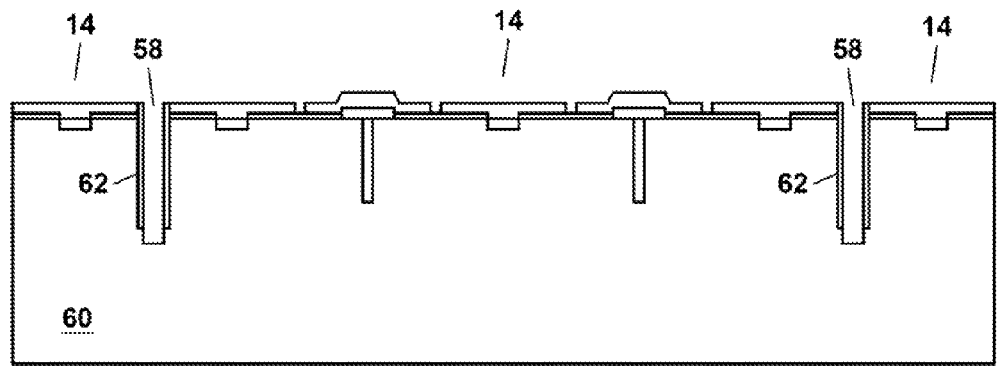

With the conformal film 62 in place, a reactive ion etching step can be used to etch down through the bottom of the conformal film 62 and into the {111}-oriented silicon substrate 60 for up to a few more microns. The additional etching exposes the {111}-oriented silicon as shown in FIG. 4C.

Figure 4D:
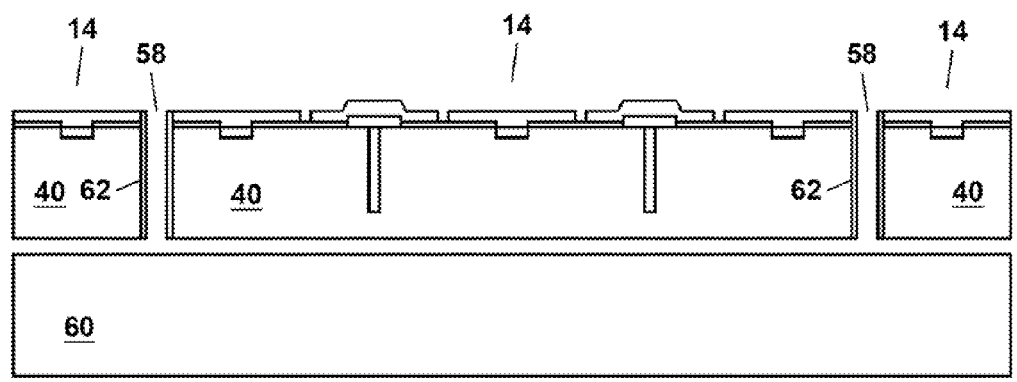

In FIG. 4D, a selective etching step using an anisotropic wet etchant such as KOH, TMAH, EDP, sodium hydroxide (NaOH), cesium hydroxide (CsOH), rubidium hydroxide (RbOH) or ammonium hydroxide (NH$_4$OH) can be performed to laterally etch the exposed silicon beneath the solar cell 14. The anisotropic wet etching preferentially etches certain crystalline directions in the {111}-oriented silicon substrate 60, but will not etch through {111} crystalline planes of silicon since the etching is terminated upon reaching a {111} crystalline plane of silicon. Thus, the selective etching step in FIG. 4D completely undercuts the solar cells 14 to release them from the {111}-oriented silicon substrate 60. The remainder of the {111}-oriented silicon substrate 60 in FIG. 4D, which has been separated from the solar cells 14, will be left with a very smooth {111}-oriented upper surface which can be optionally polished, if needed, and then re-used to form additional solar cells 14. This process can be repeated multiple times until the {111}-oriented silicon substrate 60 becomes to thin to handle. At that time, the {111}-oriented silicon substrate 60 can be attached to a handle wafer, which need not be silicon, to allow for a complete utilization of the {111}-oriented silicon substrate 60. This provides a cost effective method of fabricating a large number of solar cells 14 from a single {111}-oriented silicon substrate 60.

In each of the methods described above, the solar cells 14 can be released into the wet etchant and then washed to completely remove the etchant. Alternately, prior to completion of the release of the solar cells 14 using the selective etching step, a carrier substrate or film can be attached over the solar cells 14 being formed with openings to provide access for the wet etchant so that the release of the solar cells 14 can be completed.

With the solar cells 14 released and attached to the carrier substrate or film, an anti-reflection coating 64 can be deposited on the surface of the solar cells 14 opposite the electrical contacts 48 and 50 (see FIG. 2B). The anti-reflection coating 64 can comprise, for example, a one-quarter wavelength thick layer of silicon dioxide or silicon nitride, and is useful to increase the amount of the sunlight 100 which is transmitted into each solar cell 14.

The completed solar cells 14 and the feedback control circuit 30 can be attached to the substrate 12 in FIG. 1 with conventional pick-and-place technology using an electrically-conductive epoxy or solder. Alternatively, a fluidic self-assembly process can be used when a large number of solar cells 14 are to be arrayed on the substrate 12 to form the photovoltaic solar concentrator 10.

Fluidic self assembly involves dispensing a slurry containing a fluid and a plurality of the solar cells 14 over a surface of the substrate 12 which can include a plurality of receptor sites adapted to receive the solar cells 14. These receptor sites can be etched or molded recesses in the substrate 12 or in a material layer deposited thereon, with each recess being shaped to receive one of the solar cells 14. Alternately, these receptor sites can be chemically conditioned to be hydrophobic or hydrophilic to attract a surface of the solar cells 14 which is also chemically conditioned to be hydrophobic or hydrophilic and thereby attract and align the solar cells 14 onto the receptor sites on the substrate 12 due to free energy minimization. Those skilled in the art will understand that many different processes can be used for fluidic self-assembly of the solar cells 14 onto the substrate 12, including shape matching, hydrophobic attraction, hydrophilic attraction, capillary attraction, magnetic force attraction, and electrostatic attraction. Further details of fluidic self-assembly processes can be found in U.S. Pat. Nos. 7,172,789; 7,244,326; and 7,251,882; and also in an article by U. Srinivasan et al., entitled "Microstructure to Substrate Self-Assembly Using Capillary Forces," in the *Journal of Microelectromechanical Systems*, vol. 10, pp. 17-24, March 2001, each of which is incorporated herein by reference. Fluidic self assembly is advantageous since this is a parallel assembly process whereby a large number of solar cells 14 can be simultaneously positioned on the substrate 12 and attached thereto. This parallel assembly process can reduce the cost for the photovoltaic solar concentrator 10 when compared to conventional pick-and-place technology which is a serial assembly process.

Figure 5A:
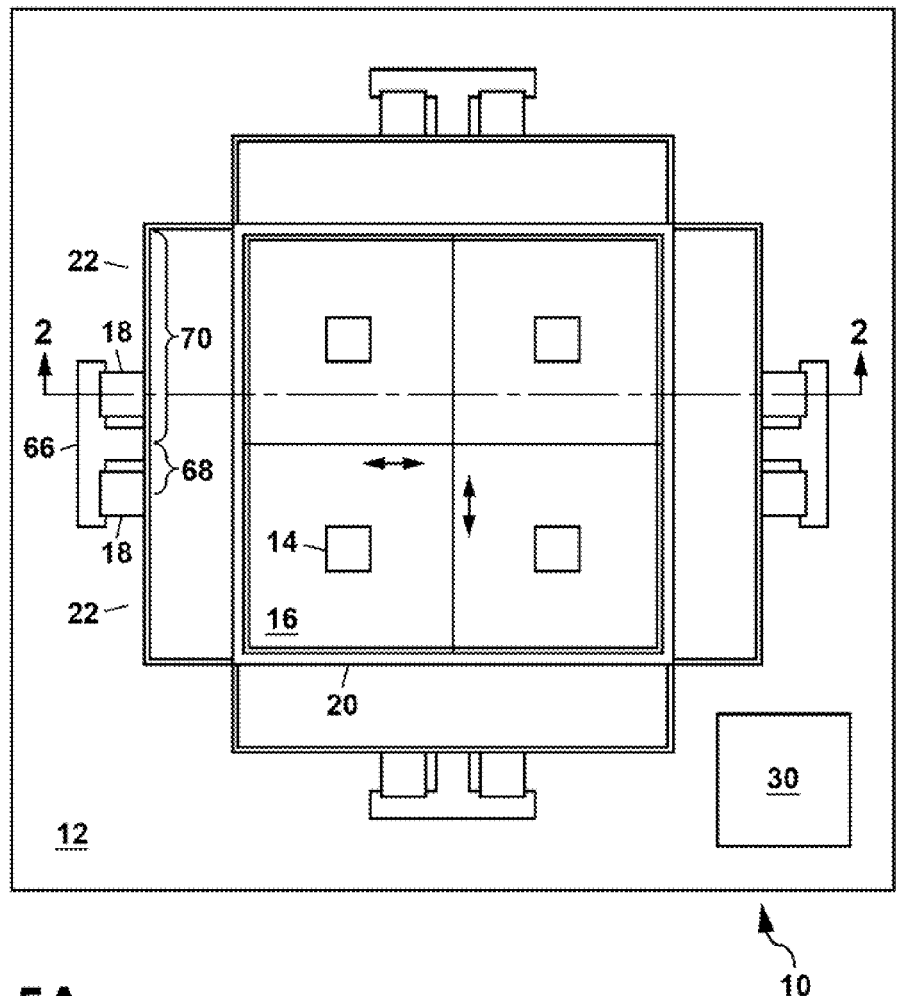
FIGS. 5A and 5B show a schematic plan view and a schematic cross-section view (along the section line 2-2 in FIG. 5A) of a second example of the photovoltaic solar concentrator of the present invention.
Figure 5B:
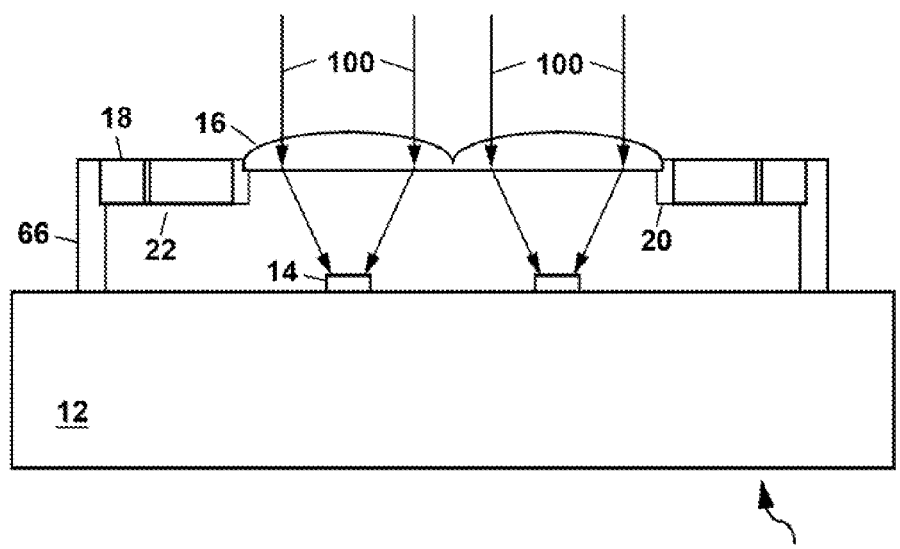

FIGS. 5A and 5B schematically illustrate in plan view and in cross-section view, respectively, a second example of the photovoltaic solar concentrator 10 of the present invention. The device 10 of FIGS. 5A and 5B functions similarly to that of FIG. 1 except that a plurality of lenses 16 are translated laterally to maintain the sunlight 100 incident on the solar cells 14. In this example of the present invention, the substrate 12 can comprise the same materials as the first example of the photovoltaic solar concentrator 10 in FIG. 1 (e.g. stainless steel or a uv-stabilized polymer). The solar cells 14 can fabricated as described with reference to FIGS. 2A and 2B with transverse semiconductor junctions, but are shown as being square in shape in this example of the present invention. The polycrystalline silicon regions 44 and the ion-implanted regions 46 in each solar cell 14 can be arranged in an alternating pattern (e.g. a checkerboard pattern). In the example of FIGS. 5A and 5B, the lenses 16 are also shown square in shape and connected together as a unit. This arrangement of the lenses 16, which can be molded from a uv-stabilized polymer, provides a 100% fill factor. The lenses 16 can also include an anti-reflection coating on one or both sides thereof to increase the transmission of the sunlight 100 through the lenses 16.

The frame 20, the displacement-multiplier linkage 22 and a plurality of support posts 66 can also all be fabricated from a uv-stabilized polymer. In some embodiments of the present invention, the frame 20, linkage 22 and support posts 66 can all be molded as a unit to simplify assembly of the solar concentrator 10 and to reduce cost. The lenses 16 can be formed as a separate unit (e.g. when the lenses 16 comprise a different material), or alternately can be molded together with the other elements 20, 22 and 66.

Although only a few solar cells 14 and lenses 16 are shown in FIGS. 5A and 5B, the photovoltaic solar concentrator 10 in this example of the present invention can include up to thousands or more of individual lenses 16 with each lens 16 having lateral dimensions, for example, in the range of 1-10 millimeters. The exact number and size of the lenses 16 will depend upon the electrical power to be generated by the solar concentrator 10. Additionally, although the lenses 16 are shown in this example as refractive lenses 16, those skilled in the art will understand that the lenses 16 can also be diffractive lenses 16 (i.e. Fresnel lenses).

Two piezoelectric actuators 18 are supported between each support post 66 and a displacement-multiplier linkage 22 as shown in FIGS. 5A and 5B. The piezoelectric actuators 18 can be commercially-available piezoelectric stacks with lead wires (not shown) that can be attached to wiring on the substrate 12. The piezoelectric actuators 18 are used in combination with displacement-multiplier linkages 22 to move the lenses 16 as needed to maintain the sunlight 100 concentrated on the solar cells 14.

Each displacement-multiplier linkage 22 is suspended above the substrate 12 by being attached at one end thereof to one of the support posts 66, and by being attached at an opposite end thereof to the frame 20 or, in some cases, directly to one of the lenses 16 (e.g. for embodiments in which no frame 20 is used). Each displacement-multiplier linkage 22 has a short arm 68 extending between the support post 66 and an adjacent piezoelectric actuator 18, and a long arm 70 extending from the support post 66 to a point at which the displacement-multiplier linkage 22 bends to provide an attachment to the frame 20 (see FIG. 5A). With this arrangement, an input displacement provided by each piezoelectric actuator 18 upon electrical activation by an applied voltage can be increased (i.e. multiplied) by an amount which is approximately equal to the ratio of the long arm 70 to the short arm 68.

Each displacement-multiplier linkage 22 can have a thickness in a direction normal to the substrate 12 which is greater than the width of the arms 68 and 70. This provides a stiffness to resist any vertical movement of the lenses 16 while allowing a force provided by the piezoelectric actuators 18 to be transmitted through the long arm 70 to move the lenses 16. The relatively small width of the arms 68 and 70 allows the arms 68 and 70 to act as springs and bend as needed while laterally moving the lenses 16. This spring-like nature of the arms 68 and 70 also provides a restoring force that urges the lenses 16 back to an initial rest position when the actuation voltage is removed from the piezoelectric actuators 18. At the point of attachment of the long arms 70 to the frame 20, each arm 70 can be further thinned, if needed, to form a flexure.

To move the lenses 16 laterally from left to right in FIG. 5A, an actuation voltage can be applied to the pair of piezoelectric actuators 18 located on the left-hand side of the photovoltaic solar concentrator 10, with the pair of piezoelectric actuators 18 on the right-hand side of the solar concentrator 10 being un-powered. To move the lenses from right to left in FIG. 5A, the actuation voltage can be applied to the pair of piezoelectric actuators 18 on the right-hand side of the photovoltaic solar concentrator 10, with the pair of piezoelectric actuators on the left-hand side of the solar concentrator 10 being un-powered. A horizontal double-sided arrow in FIG. 5A shows this sideways movement of the lenses 16. Operation of the remaining two pairs of piezoelectric actuators 18 can be used to move the lenses 16 in an orthogonal direction as indicated by the vertically-oriented two-headed arrow in FIG. 5A.

In the example of FIGS. 5A and 5B, the solar cells 14 can be connected in series, or in parallel, or in a series/parallel arrangement depending upon an output voltage and current which are to be provided by the photovoltaic solar concentrator. One or more of the solar cells 14 can also be connected to a feedback control circuit 30 which can be located either off the substrate 12, or on the substrate 12 as schematically illustrated in FIG. 5A. The feedback control circuit 30 can control each of the piezoelectric actuators 18 to maintain the sunlight incident onto the solar cells 14 using an electrical input signal provided by one or more of the solar cells 14.

Figure 6:
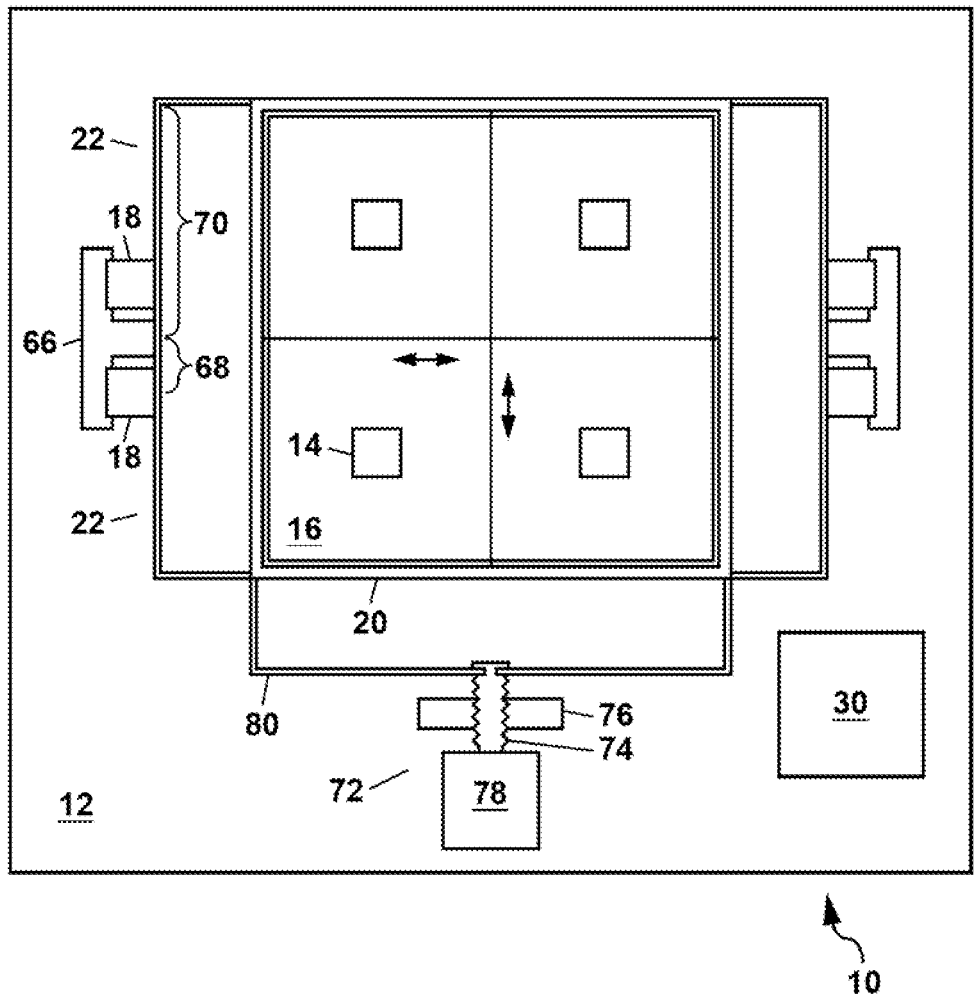
FIG. 6 shows a schematic plan view of a third example of the photovoltaic solar concentrator of the present invention.

FIG. 6 shows a schematic plan view of a third example of the photovoltaic solar concentrator 10 of the present invention. This example of the present invention can be fabricated similar to that of FIGS. 5A and 5B except that the piezoelectric actuators 18 are used to control motion of the lenses 16 only in one direction as indicated by the horizontal double-sided arrow in FIG. 6. This lateral back and forth motion provided by the piezoelectric actuators 18 in FIG. 6 is sufficient to maintain the sunlight 100 incident on the solar cells 14 over the course of a day when the photovoltaic solar concentrator is properly oriented since the sun follows an approximately straight-line path. To adjust the position of the lenses 16 from day to day due to the movement of the straight-line path as the angle of the sun changes from its maximum value at the summer solstice to its minimum value at the winter solstice, a screw actuator 72 can be used. The screw actuator 72 can comprise an adjustment screw 74 which is engaged in a threaded member 76 supported on the substrate 12. The adjustment screw 74 can be adjusted each day to push or pull on the lenses 16 in the direction indicated by the vertically-oriented double-headed arrow in FIG. 6. In this way, the lenses 16 can be positioned onto the straight-line path of the sun for that day so that only the piezoelectric actuators 18 need be adjusted to maintain the sunlight 100 on the solar cells 14. This can be done manually (e.g. with a position scale on the screw actuator 72 which can be used to set the adjustment screw 74 each day using a look-up table), or can be automated with a motor 78 (e.g. an electric motor or a stepping motor) that can be controlled by the feedback control circuit 30. When positioning of the adjustment screw 74 is automated, the feedback control circuit 30 can periodically check the positioning of the adjustment screw 74 by dithering the movement of the adjustment screw 74 using the motor 78 and sensing a change in the electrical power output from one or more of the solar cells 14. In this way, the positioning of the lenses in the up and down direction in FIG. 6 can be optimized, for example, to correct for a slight misalignment of the photovoltaic solar concentrator relative to the path of the sun over the course of a day.

The screw actuator 72 can be coupled to the frame 20 using a flexible linkage 80 which allows the screw actuator 72 to push and pull on the linkage 80 and thereby move the frame 20 and lenses 16 away from the screw actuator 72 or towards the screw actuator 72 depending upon the angle of the sun for a particular day. Alternately, the screw actuator 72 can be slidingly connected to the frame 20 (e.g. with a horizontal slot being formed in the frame 20 wherein the adjustment screw 74 is engaged and captured.

In other embodiments of the photovoltaic solar concentrator, the screw actuator 72 in FIG. 6 can be replaced by other types of actuators known to the art including a linear motor, a piezoelectric stepper motor, a direct-drive linear actuator, a pneumatic linear actuator or a hydraulic linear actuator. The piezoelectric actuators 18 in FIG. 6 can also be replaced by other types of actuators known to the art including linear motors, piezoelectric stepper motors, direct-drive linear actuators, pneumatic linear actuators and hydraulic linear actuators.

Figure 7:
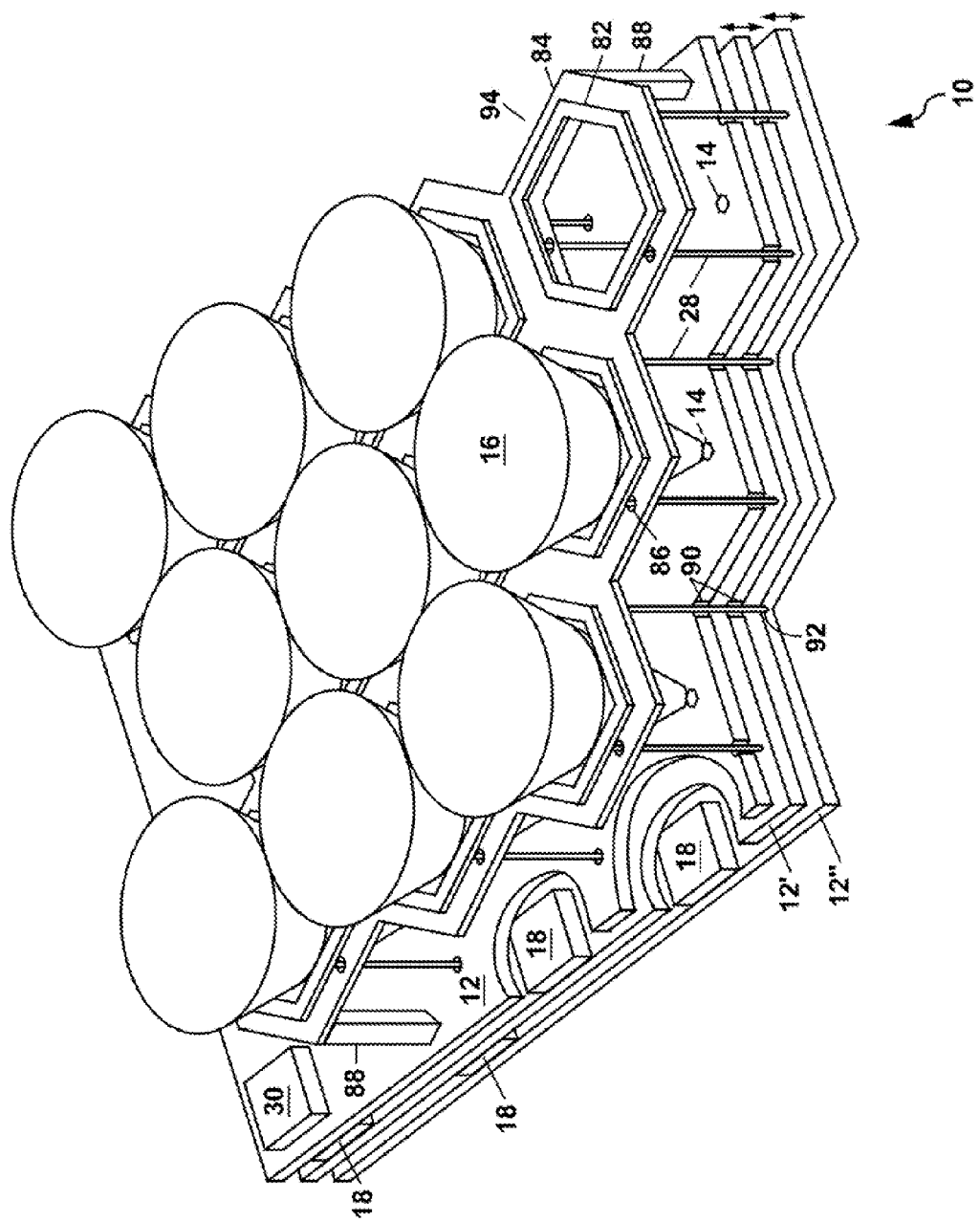
FIG. 7 shows a partial cutaway schematic perspective view of a fourth example of the photovoltaic solar concentrator of the present invention.

FIG. 7 shows a partial cutaway schematic perspective view of a fourth example of the photovoltaic solar concentrator 10 of the present invention. In this example of the present invention, a substrate 12 is provided with a plurality of solar cells 14 arrayed thereon. The solar cells 14 can be transverse-junction solar cells as previously described with reference to FIGS. 2A and 2B. A plurality of lenses 16 are supported on a tilt plate 82 (also termed a tilt ring) above one of the solar cells 14. One of the lenses 16 has been removed in FIG. 7 to better show details of the tilt plate 82 and an underlying truss 84 which can have a honeycomb shape, for example.

The tilt plate 82 can be annular with a polygonal or circular shape adapted to hold a lens 16. Each tilt plate 82 is supported on a plurality of legs 28 (e.g. three legs as shown in the example of FIG. 7), with each leg 28 associated with a particular tilt plate 82 generally having a different length. The legs 28 pass through slots or openings 86 in the truss 84 which can be supported on the substrate 12 by a plurality of support posts 88. The truss 84 is useful to hold the plurality of tilt plates 82 and the plurality of legs 28 together when these elements are formed together as a tilt-control unit 94 which will be described in greater detail hereinafter. Additionally, the truss 84 is useful to minimize any lateral movement of the legs 28 while allowing the legs 28 to move in a direction substantially perpendicular to the substrate 12 to tilt each lens 16 as needed to maintain the sunlight 100 incident on the solar cells 14.

To move the legs 28 up and down and thereby tilt each lens 16, a second substrate 12' and a third substrate 12" are provided beneath the first substrate 12 in the example of FIG. 7. As will become apparent from the following discussion, the substrates 12, 12' and 12" can be stacked in any order. The solar cells 14 can also be located on any of the substrates 12, 12' and 12" since openings through one or more of the substrates 12, 12' and 12" can be provided to allow the sunlight 100 to reach the solar cells 14.

Sandwiched between each adjacent pair of the substrates 12, 12' and 12" are a plurality of piezoelectric actuators 18 which can be electrically activated with an applied voltage from a feedback control unit 30 on one of the substrates 12, 12' and 12" to move one or more of the substrates vertically relative to the other substrates. Motion of the substrates 12' and 12" relative to the substrate 12 is schematically illustrated in FIG. 7 by the vertically-oriented double-headed arrows. When sets of the piezoelectric actuators 18 are located between each adjacent pair of the substrates 12, 12' and 12" as shown in FIG. 7, each set of the piezoelectric actuators 18 (i.e. a first set of the actuators 18 located between the first and second substrates 12 and 12', and a second set of the actuators 18 located between the second and third substrates 12' and 12") can be electrically connected in parallel to facilitate movement of the substrates relative to each other in the vertical direction while maintaining the substrates 12, 12' and 12" substantially parallel to each other.

An advantage of the example of the photovoltaic solar concentrator 10 of FIG. 7 is that it can accommodate piezoelectric actuators 18 having an arbitrary size and shape to provide a predetermined displacement which can be, for example, up to one millimeter or more. Additionally, this example of the solar concentrator 10 can accommodate many different types of piezoelectric actuators 18 known to the art, including bare or packaged piezoelectric stacks, lever-amplified piezoelectric actuators, and piezoelectric bender actuators. The piezoelectric actuators 18 can be attached to the substrates 12, 12' and 12" using solder or an adhesive (e.g. epoxy), or alternately using mechanical hardware (e.g. screws or nuts). The substrates 12, 12' and 12" can comprise, for example, stainless steel or a polymer (e.g. a uv-stabilized polymer).

The piezoelectric actuators 18 can be assembled, for example, beginning with the first substrate 12. A first set of the piezoelectric actuators 18 can be attached to a bottom surface of this first substrate 12, with the first substrate 12 including wiring on the bottom surface thereof to provide electrical connections to the first set of the piezoelectric actuators 18. Electrical vias can be provided through the first substrate 12 to connect the wiring on the bottom surface to other wiring on a top surface of the first substrate 12. Alternately, electrical connections of the first set of the piezoelectric actuators 18 can be made directly to the top surface of the first substrate 12 (e.g. by passing wires connected to the first set of the piezoelectric actuators 18 through openings through the first substrate 12 and connecting the wires to metal traces on the top surface of the first substrate 12).

The second substrate 12' can then be attached to the first set of the piezoelectric actuators 18. This sandwiches the first set of the piezoelectric actuators 18 between the first and second substrates 12 and 12'. A second set of the piezoelectric actuators 18 can then be attached to the bottom of the second substrate 12' and connected to wiring on the bottom surface of the second substrate 12'. Alternately, wires connected to the second set of the piezoelectric actuators 18 can be passed through openings through the first and second substrates 12 and 12' and soldered directly onto the metal traces on the top surface of the first substrate 12. Once this is done, a third substrate 12" can be attached to the second set of the piezoelectric actuators 18. If other electrical connections are needed between the various substrates 12, 12' and 12", such electrical connections can be made, for example, using flexible cables. Those skilled in the art will understand that the order of assembly described above can be reversed to begin with the third substrate 12" and build the solar concentrator 10 upward therefrom.

In the example of FIG. 7, one leg 28 of each tilt plate 82 can be attached either to the truss 84, or to the substrate 12. The remaining two legs 28 can be attached to the substrates 12' and 12" so that a movement of the substrates 12, 12' and 12" up and down relative to each other will, in turn, move the various legs 28 up and down to tilt the lenses 16, as needed, to maintain the sunlight 100 incident on each solar cell 14. It should be noted that all the lenses 16 move in unison in the example of FIG. 7.

To allow the various legs 28 to be attached to the different substrates 12' and 12", openings 90 can be formed through the substrates 12 and 12' as shown in a cutaway portion of FIG. 7. Another opening 92, which provides an interference fit with the leg 28 inserted therein, can be provided in each substrate 12, 12' or 12" or in the truss 84 when one of the legs 28 is attached to the truss 84. To ensure that each leg 28 is properly mated with one of the substrates or with the truss 84, the opening 92 can extend only partway through the substrate as shown in FIG. 7, or partway through the truss 84. Alternately, a shoulder can be provided on each leg 28 to limit an extent of insertion that leg 28 into the opening 92.

In some embodiments the tilt plates 82, the truss 84, the support posts 88 and the legs 28 can all be integrally formed (e.g. by molding a uv-stabilized polymer) as a tilt-control unit 94. In this case, the legs 28 of each tilt plate 82 can be attached at one end thereof, with one of the legs 28 being attached at the other end thereof to the truss 84, and with the remaining legs 28 being free standing. The leg 28 connecting each tilt plate 82 to the truss 84 can be optionally thinned at one or both ends thereof to act as a flexure to allow the tilt plate 82 and the lens 16 supported thereon to be tilted by a vertical movement of the remaining legs 28.

Fabricating the various elements 28, 82, 84 and 88 as an integral unit 94 can simplify assembly and repair of the photovoltaic solar concentrator and to reduce the costs associated therewith. The solar cells 14 and piezoelectric actuators 18 can also be assembled on the various substrates 12, 12' and 12" as a separate unit to allow for testing of these elements before adding the tilt control unit 94 and lenses 16. If repair of the photovoltaic solar concentrator 10 of FIG. 7 is needed, for example, to replace one or more defective solar cells 14, the lenses 16 and tilt-control unit 94 can be separated from the various substrates 12, 12' and 12" as a unit thereby reducing the cost of repair of the solar concentrator 10. The attachment of the tilt-control unit 94 to the various substrates 12, 12' and 12" can be performed with fasteners such as screws (e.g. by providing a screw tab on the support posts 88), or by shaping a free end of each support post 88 to form a pin or a barb which can be inserted into an opening through the substrate 12. The legs 28 can be inserted into the substrates 12, 12' or 12" through the openings 90 in the substrates 12 and 12' until each leg 28 mates with a particular substrate 12, 12' or 12" and held in place by an interference fit.

The lenses 16 can be inserted into the tilt plates 82 and held in place with an adhesive (e.g. an epoxy or polymer adhesive). Alternately, the tilt plates 82 and/or the lenses 16 can be shaped so that the lenses 16 can be snapped into the tilt plates 82. This can be done, for example, by forming a slight recess or protrusion around the edge of each lens 16 to capture and hold the tilt plate 82 securely to the lens 16 when the lens 16 is mated with a complementary protrusion or recess formed around the opening through the tilt plate 82.

Figure 8:
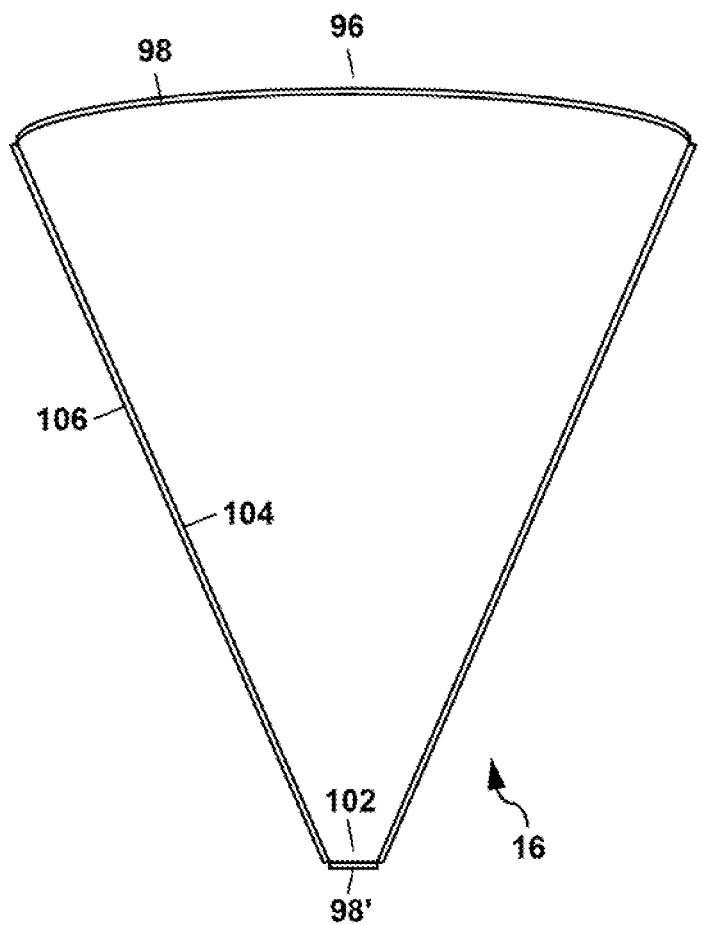
FIG. 8 shows a schematic cross-section view of one of the lenses in the photovoltaic solar concentrator of FIG. 7 to illustrate the construction of this lens.

The particular lenses 16 shown in FIG. 7 can be formed with an upper surface 96 which is generally curved, and which can optionally include an anti-reflection coating 98. This is schematically illustrated in FIG. 8 which shows a cross-section view of one of the lenses 16 in FIG. 7. A lower surface 102 of each lens 16 can be curved or flat, and can also optionally include another anti-reflection coating 98' thereon. The lenses 16 can also have a tapered sidewall 104 which can optionally include a light-reflective coating 106 deposited thereon. The light-reflective coating 106 can comprise, for example, a metal such as gold or aluminum which can be overcoated with a protective layer (not shown) comprising, for example, a polymer to prevent degradation of the light-reflective coating 106 over time from exposure to the environment (e.g. oxidation of an aluminum coating 106). The protective layer can also protect the light-reflective coating 106 during handling of the lenses 16 and insertion of the lenses 16 into the tilt plates 82, and can also facilitate attachment of the lenses 16 to the tilt plates 82, since the recess or protrusion can be formed in the protective layer rather than in the lens 16 so as not to impair the performance of the light-reflective coating 106.

The lenses 16 in FIGS. 7 and 8 can have lateral dimensions ranging from a few millimeters up to one centimeter or more. To reduce fabrication costs for the lenses 16, they can be molded (e.g. from glass or a uv-stabilized polymer). The light-reflective coating 106 can be initially deposited on the lenses 16 in a batch fabrication process with the lenses 16 inverted. to protect the upper surface 96 of the lenses 16. The lower surface 102 of each lens 16 can be protected with a layer of a removable or strippable material, or alternately with a removable cap. Alternately, the lower surface 102 can be coated with the light-reflective coating 106 which can then be removed by a polishing step. The anti-reflective coatings 98 can then be deposited over the upper and lower surfaces 96 and 102 and also over the light-reflective coating 106. In some cases the anti-reflective coating 98 covering the light-reflective coating 106 can form the protective layer. In other cases, the protective layer can be deposited separately prior to depositing the anti-reflective coating 106.

The lenses 16 in FIGS. 7 and 8 concentrate the incident sunlight 100 onto the solar cell 14. By providing the light-reflective coating 106 on the lenses 16 as shown in FIG. 8, any of the incident sunlight 100 which is not focused by the lenses 16 will nevertheless be directed towards the solar cell 14 by being reflected off the light-reflective coating 106 which acts as a light funnel to channel the sunlight 100 onto each solar cell 14. The light-reflective coating 106 also functions to channel off-axis rays of the sunlight 100, and sunlight 100 which is forward scattered in the lens 16 by defects or impurities therein. Thus, the light-reflective coating 106 can improve a light-transmission efficiency of the lenses 16. The light-reflective coating 106 is also useful to collect and transmit the sunlight 100 to the solar cell 14 when the lenses 16 reach an end of their range of tilting since the sunlight 100 will still be incident on the upper surface 96 of each lens 16 and can follow a zig-zag path downward through the lens 16 to the solar cell 14 located therebeneath as the sunlight 100 bounces back and forth off the light-reflective coating 106. In other embodiments of the present invention, diffractive lenses (i.e. Fresnel lenses) can be substituted for the refractive lenses 16 shown in FIG. 7.

A feedback-control circuit 30 can be located on the substrate 12 as schematically illustrated in FIG. 7, or alternately on the substrates 12' or 12". In certain embodiments of the photovoltaic solar concentrator 10 of the present invention, the feedback-control circuit 30 can be located separately from the solar concentrator 10 (i.e. not on any of the substrates 12, 12' and 12"). The feedback-control circuit 30 can be used as previously described to control movement of the lenses 16 to maintain the sunlight 100 concentrated onto the solar cells 14.

In the event that heating of the substrate 12 due to the sunlight 100 incident on the solar cells 14 is excessive, active or passive cooling of the substrate 12 in the example of FIG. 7 can be implemented. This can be done, for example, by forming the substrate 12 with one or more fluid channels (not shown) and actively or passively flowing a cooling fluid through the fluid channels to cool the substrate 12. As another example, a fluid can be passively or actively flowed between the first and second substrates 12 and 12', or overtop the first substrate 12. When the fluid is flowed overtop the first substrate 12, this can be done, for example, by enclosing the photovoltaic solar concentrator 10 within a housing having a transparent top and then filling the housing with a uv-stable, inert fluid such as a perfluorocarbon fluid which is commonly used for cooling of electronic circuits.

Figure 9:
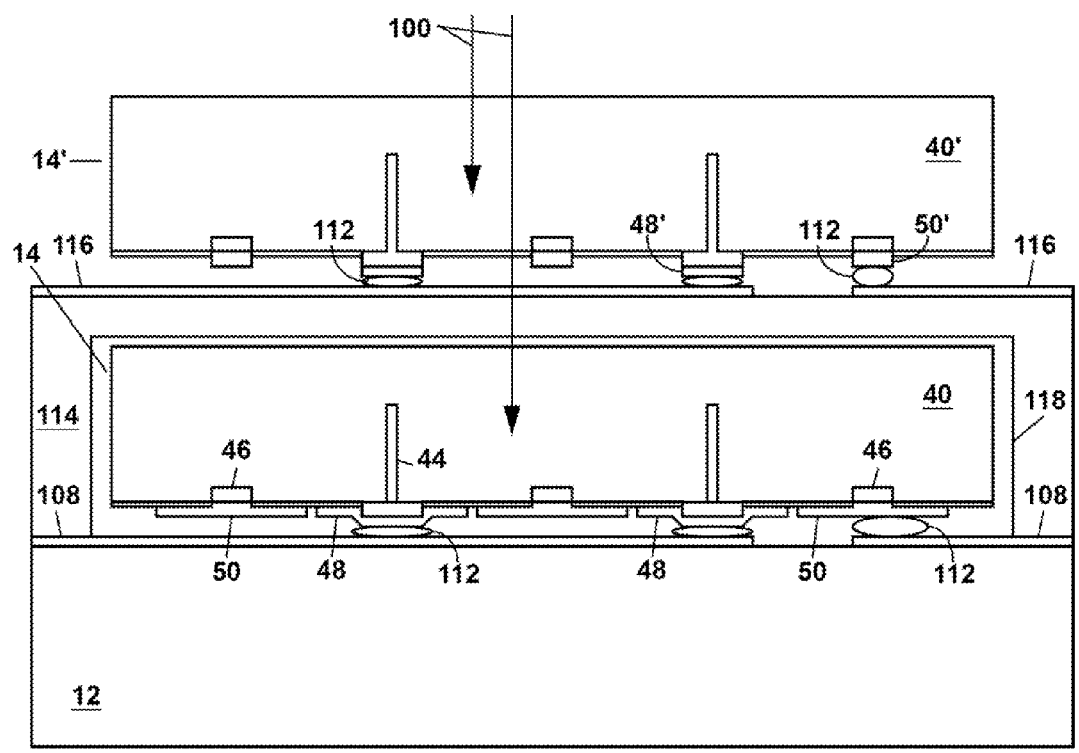
FIG. 9 shows a schematic cross-section view of a plurality of solar cells stacked one upon the other which can be used to increase a sunlight-to-electrical energy conversion efficiency of the photovoltaic solar concentrator of the present invention.

Although the various examples of the photovoltaic solar concentrator 10 have been described so far with a single solar cell 14 located beneath each lens 16, in, other embodiments of the photovoltaic solar concentrator 10 of the present invention, multiple solar cells 14 can be stacked up one upon the other to increase the sunlight-to-electrical energy conversion efficiency of the photovoltaic solar concentrator 10. This can be done as schematically illustrated in the cross-section view of FIG. 9 which shows an example of two solar cells 14 and 14' stacked one upon the other, with each solar cell 14 and 14' operating over a different wavelength range. In FIG. 9, a first solar cell 14 can be attached to the substrate 12 and electrically connected to metal traces 108 thereon using solder 112, or an electrically-conducting epoxy. The contacts 48 and 50 in the first solar cell 14 can be made wide as previously described with reference to FIGS. 2A and 2B to act as mirrors to reflect any unabsorbed sunlight 100 back through the first solar cell 14 a second time.

A second solar cell 14' can be mounted above the first solar cell 14. This can be done, for example, by attaching the second solar cell 14' to a transparent carrier tape 114 which includes metal traces 116 on an upper surface thereof. The carrier tape 114, which can comprise, for example, a uv-stabilized polymer, can also include a recess 118 formed therein sized to fit over the first solar cell 14. An adhesive backing on a surface of the carrier tape 114 which contacts the substrate 12 can be used to attach the carrier tape 114 to the substrate 12. Electrical connections between the metal traces 116 on the carrier tape 114 and the metal traces 108 on the substrate 112 can be made, for example, using wire bonds.

In the example, of FIG. 9, the second solar cell 14' can comprise silicon with a bandgap energy of about 1.1 electron Volts (eV); and the first solar cell 14 can comprise germanium with a bandgap energy of about 0.7 eV. Thus, the second solar cell 14' comprising silicon will absorb the incident sunlight 100 over a wavelength range extending from the ultraviolet up to about 1.1 µm in the near infrared region of the solar spectrum. This portion of the sunlight 100, which is absorbed by the second solar cell 14', is indicated by the short vertical arrow in FIG. 9. A range of wavelengths of the sunlight 100 from about 1.1-1.8 µm and any of the sunlight 100 at lower wavelengths which is not absorbed by the second solar cell 14' can be absorbed by the first solar cell 14 which comprises germanium. This portion of the sunlight 100 is indicated by the long vertical arrow in FIG. 9. The electrical current generated in each solar cell 14 and 14' is collected by separate wiring (i.e. the electrical traces 108 and 116) so that there is no requirement for matching of the electrical currents generated by the two solar cells 14 and 14' in the example of FIG. 9. To allow the sunlight 100 passing through the second solar cell 14' to enter the first solar cell 14, electrical contacts 48' and 50' on the second solar cell 14' can have a smaller width than the contacts 48 and 50 on the first solar cell 14.

In other embodiments of the present invention, the second solar cell 14' in FIG. 9 can comprise a III-V compound semiconductor such as gallium arsenide or indium phosphide with a bandgap energy of about 1.4 eV; and the first solar cell 14 can comprise silicon. Additional solar cells can also stacked up beyond the two solar cells 14 and 14' shown in FIG. 9. As an example, a third solar cell comprising gallium arsenide can be attached above the second solar cell 14' in FIG. 9 using another transparent carrier tape 114 to form a stacked three junction solar cell to further increase the sunlight-to-electrical energy conversion efficiency of the photovoltaic solar concentrator 10.

Figure 10:
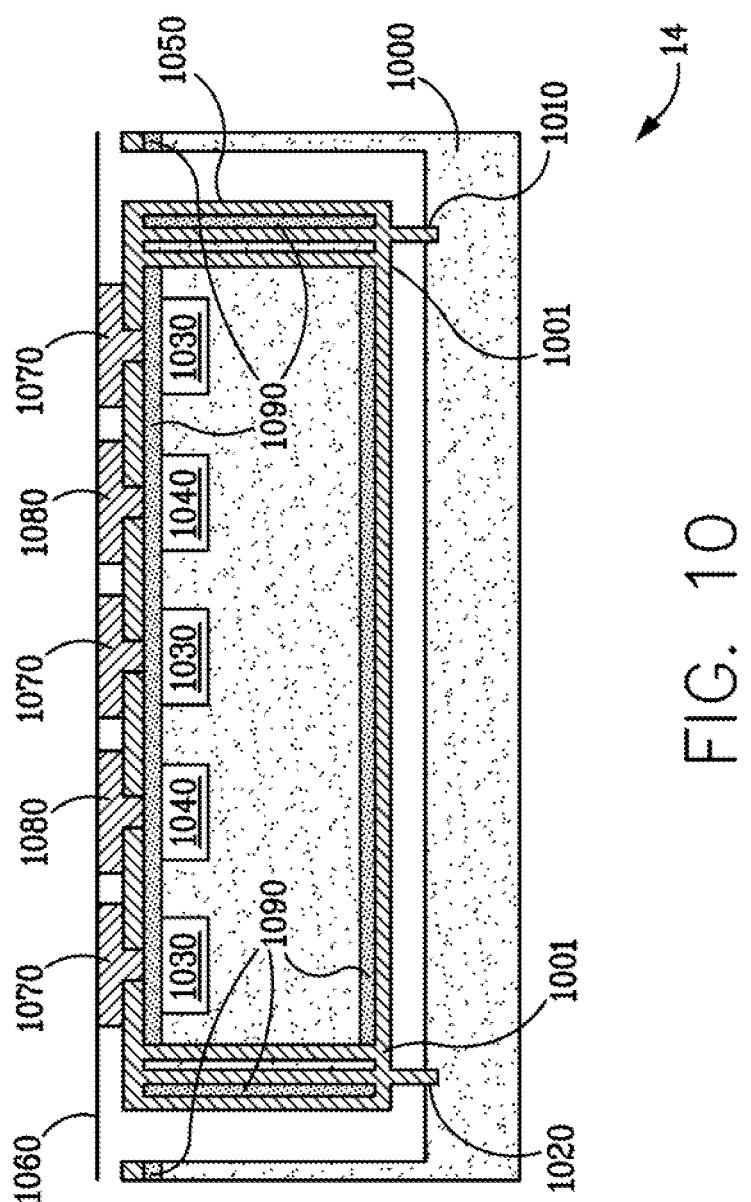
FIG. 10 shows a schematic cross-section view (along the section line 1-1 in FIG. 2A) to illustrate fabrication of the transverse-junction photovoltaic solar cell of FIG. 2A on a {111}-oriented silicon wafer.

FIG. 10 shows a schematic cross-section view (along the section line 1-1 in FIG. 2A) to illustrate fabrication of the transverse-junction photovoltaic solar cell of FIG. 2A on a {111}-oriented silicon wafer 1000. In this embodiment, the photovoltaic solar cell 14 is suspended with posts 1010, 1020 such that a passivation layer 1050 can be deposited over all exposed surfaces of the photovoltaic solar cell 14, including top, bottom, and sidewalls, during fabrication. This is in contrast to sawing the cells so that not all surfaces, e.g., sidewalls, are covered with a passivation layer. After fabrication is complete, the photovoltaic solar cell 14 can be detached from the remainder of the {111}-oriented silicon wafer 1000 using an adhesive material 1060, e.g., adhesive tape, thus breaking the posts 1010, 1020 that were suspending the photovoltaic solar cell 14 over the remainder of the {111}-oriented silicon wafer 1000. FIG. 10 depicts the posts 1010, 1020 intact, but after the photovoltaic solar cell 14 is removed, the posts 1010, 1020 will be severed.

In one embodiment, the photovoltaic solar cell 14 is fabricated on a {111}-oriented silicon wafer in which the major surfaces are aligned along {111} crystalline planes. One set of regions 1030 are implanted in the {111}-oriented silicon wafer 1000 with a first dopant having a first doping type, e.g., n-type. Another set of regions 1040 are implanted in the {111}-oriented silicon wafer 1000 with a second dopant having a second doping type different from the first doping type. For instance, if the first doping type is n-type, the second doping type can be opposite from the n-type, i.e., p-type. These regions can be interspersed with each other, as shown, for example, in FIG. 10.

A layer of dry oxide 1090 approximately 50-100 Å is deposited over the wafer, covering the doped regions 1030, 1040. Then, a layer of silicon nitride 1050 is deposited over the oxide. An annular trench 1001 is etched partway through the {111}-oriented silicon wafer 1000 around the photovoltaic solar cell 14 being formed. The annular trench 1001 is filled with silicon nitride for passivation. Another trench or set of openings 1010, 1020 is etched partway through the {111}-oriented silicon wafer around the nitride-filled annular trench 1001 to a depth 10-15 μm greater than that annular trench 1001. If etched as openings 1010, 1020, these openings are around and outside of the annular trench 1001. This trench or set of openings 1010, 1020 is also filled with silicon nitride and will serve as suspension support as anchors or tethers. They can be approximately 1-1.5 μm wide.

Vias are etched in the silicon nitride layer. A further annular trench is etched partway through the {111}-oriented silicon wafer around the other trench or set of openings 1010, 1020 and forms the shape of the photovoltaic solar cell 14 at the sidewalls. The depth of this further annular trench exceeds the depth of the first trench 1001, but does not exceed the other trench or set of openings 1010, 1020. In one embodiment, the photovoltaic solar cell 14 has a hexagonal shape when viewed at the top or bottom major surface. Other shapes can be formed, such as a square or circle.

The further annular trench provides an opening for undercutting the photovoltaic solar cell being formed from the {111}-oriented silicon wafer by anisotropically etching using, for example, an anisotropic wet etchant such as potassium hydroxide (KOH), the {111}-oriented silicon wafer 1000 laterally with the photovoltaic solar cell 14 being attached to the {111}-oriented silicon wafer 1000 by the silicon nitride within the trench or openings 1001, 1010. Therefore, the photovoltaic solar cell 14 is not completely detached from the remainder of the {111}-oriented silicon wafer 1000, but suspended over this wafer at least at certain points. The surface of the photovoltaic solar cell 14 just undercut is the top surface of the photovoltaic solar cell 14 that, when used, sunlight will enter. Oxide is deposited over the sidewalls and top surface of the photovoltaic solar cell 14 just undercut, then a passivation layer of silicon nitride 1050 is conformally deposited on all exposed surfaces, including sidewalls, top major surface, and bottom major surface over the oxide or any other previously deposited silicon nitride. In one embodiment, an additional oxidation is utilized for surface clean-up/damage removal.

Electrical contacts of the photovoltaic solar cell 14 are then deposited. The passivation layer is etched through at locations of the doped regions 1030, 1040. An electrical contact 1070 is deposited at the etched locations of one set of regions 1030 to electrically connect the electrical contact 1070 to the dopant in each of these regions 1030. Likewise, another electrical contact 1080 is deposited at the etched locations of the other set of regions 1040 to electrically connect this electrical contact 1080 to the other dopant in each of these regions 1040.

At this stage, the photovoltaic solar cell 14 has been completely formed and is now suspended over the remainder of the silicon wafer by silicon nitride in openings 1010, 1020 that act as posts. To break these posts, an adhesive material 1060, such as adhesive tape, is placed at the bottom major surface of the photovoltaic solar cell 14. This is the surface where the electrical contacts 1070, 1080 reside, and is the major surface opposite from the top major surface that would receive the sunlight then the photovoltaic solar cell 14 is in use. Then, the photovoltaic solar cell 14 is detached by lifting the adhesive material with the photovoltaic solar cell 14 intact so as to sever the silicon nitride posts 1010, 1020 connecting the photovoltaic solar cell 14 to the remainder of the {111}-oriented silicon wafer 1000.

Multiple solar cells can be simultaneously detached from the wafer with one lift of the adhesive tape. In one embodiment, these multiple solar cells fabricated together can also be adjacently attached to each other with posts, e.g., of silicon nitride, as well and spaced approximately 3-5 μm apart. Then, when the solar cells are detached from the silicon wafer and on the tape, the tape can be stretched to sever the posts that connect adjacent cells to each other. The cells are then removed from the tape.

Figure 11:
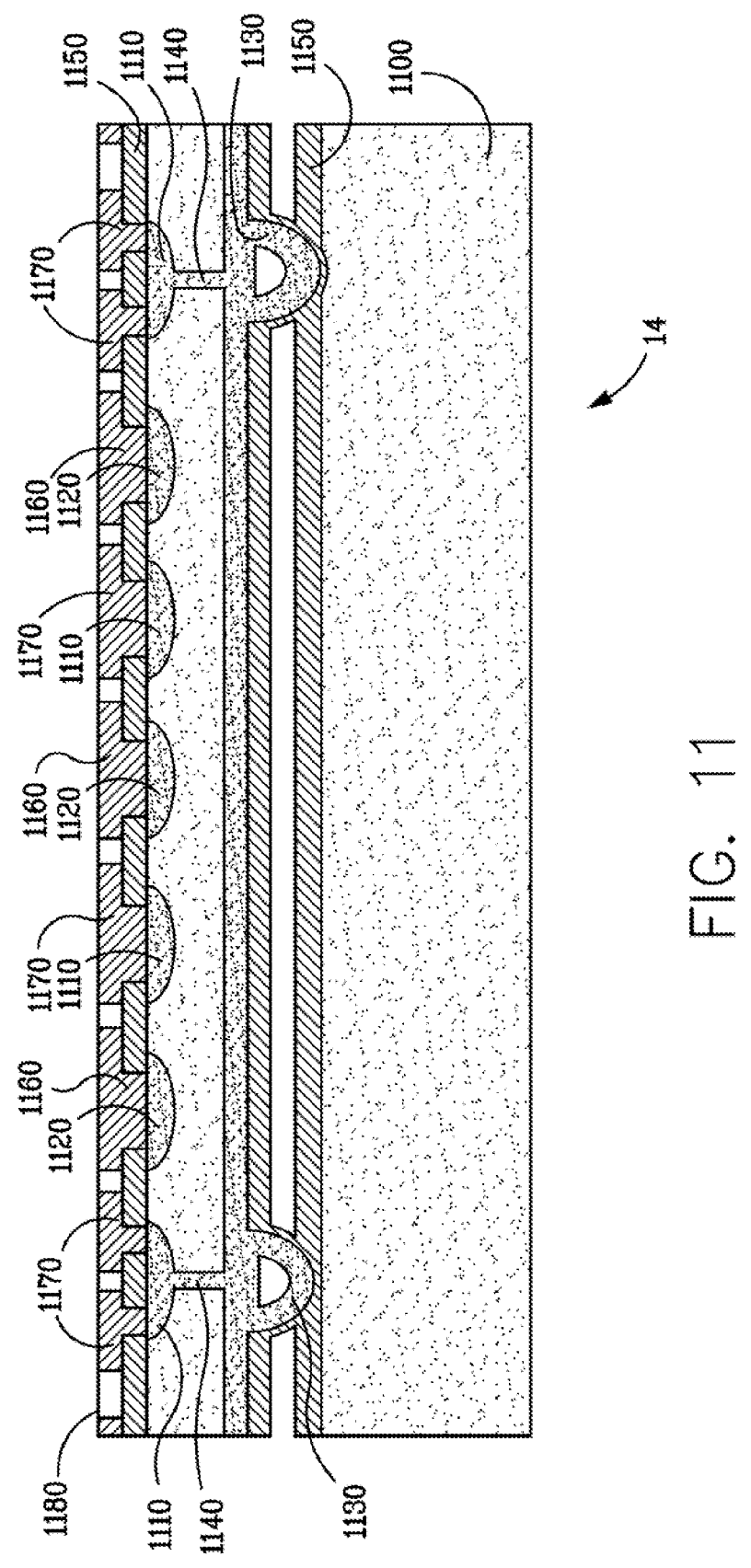

FIG. 11 shows a schematic cross-section view (along the section line 1-1 in FIG. 2A) to illustrate fabrication of the transverse-junction photovoltaic solar cell of FIG. 2A on an SOI wafer. Similar to the embodiment of FIG. 10, the embodiment of FIG. 11 depicts suspending a photovoltaic solar cell 14 in the fabrication process, allowing for passivation of all major surfaces of the photovoltaic solar cell 14. In FIG. 11, posts and anchors/tethers provide this suspension.

FIG. 11 illustrates an SOI wafer 1100 having a monocrystalline silicon body, an oxide layer on the monocrystalline silicon body, and a monocrystalline silicon layer on the oxide layer. The thickness of the monocrystalline silicon layer, and therefore the photovoltaic solar cell 14, is about 5-50 μm. Openings are etched, e.g., using deep reactive-ion etching, through the monocrystalline silicon layer and the oxide layer and spaced about a periphery of the photovoltaic solar cell 14 being formed. These openings are filled with polysilicon, thereby forming a plurality of anchors 1130 in the oxide layer and a plurality of posts 1140 in the monocrystalline silicon layer of the SOI wafer 1100. In one embodiment, the anchors 1130 include dimples. The polysilicon used to fill the post openings can be doped, e.g., n-type, or undoped. The nitride from the etching process is then stripped from the surface of the photovoltaic solar cell 14 being formed.

Doped regions are then formed at the bottom surface of the photovoltaic solar cell 14, i.e., the side of the cell opposite from the side that receives sunlight when the cell is used. Regions that are n-type-doped 1120 and regions that are p-type-doped 1110 are formed, interspersed with each other, at the monocrystalline silicon layer. Doping includes thermally diffusing an n-type dopant into the monocrystalline silicon layer to form the n-type-doped regions 1120 and thermally diffusing a p-type dopant into the monocrystalline silicon layer to form the p-type-doped regions 1110. For example, doping includes thermally diffusing the n-type dopant from a phosphosilicate glass or a phosphorous spin-on glass and thermally diffusing the p-type dopant from a borosilicate glass or a boron spin-on glass. In another example, doping includes ion-implanting phosphorous ions to form the n-type-doped regions 1120 and ion-implanting boron to form the p-type-doped regions 1110.

To create sidewalls that define the shape of the photovoltaic solar cell 14, an annular trench is etched through the monocrystalline silicon layer. Now there is an outlet through which undercutting of the photovoltaic solar cell 14 can occur. The oxide layer of the SOI wafer 1100 is etched away and therefore creates an opening beneath the photovoltaic solar cell being formed. In one embodiment, a selective etchant comprising hydrofluoric acid is used. The photovoltaic solar cell 14 is suspended over and attached to the monocrystalline silicon body of the SOI wafer 1100 by the polysilicon-filled anchors 1130. In addition, the photovoltaic solar cell 14 is attached to at least one adjacent photovoltaic solar cell by the polysilicon-filled posts 1140. Because the photovoltaic solar cell 14 is suspended, more surfaces of the cell are exposed for passivation. The passivation layer 1150, of silicon nitride, silicon dioxide, aluminum oxide, or a combination thereof, can therefore cover not just the bottom surface of the photovoltaic solar cell 14 being formed, but also the sidewalls and the top surface.

In one embodiment, at least one wraparound junction is created. After etching away the oxide layer, phosphorous-containing glass is deposited into the annular trench through the monocrystalline silicon layer and phosphorous is thermally diffused from the phosphorous-containing glass into exposed portions of the photovoltaic solar cell 14 being formed, thereby extending the p-type-doped regions 1110 to wrap around and at the top surface of the photovoltaic solar cell 14 being formed, which is at the undercut surface of the photovoltaic solar cell 14. In this embodiment, the passivation layer covers regions 1110 over the wraparound junctions as well.

Then, electrical connections are formed for the doped regions. Openings are etched through the passivation layer 1150 at locations of the n-type-doped regions 1120 and locations of the p-type-doped regions 1110. A set of electrodes 1160 are deposited over the etched passivation layer 1150 to form electrical connections to each of the n-type-doped regions 1120 and another set of electrodes 1170 are deposited over the etched passivation layer 1150 to form electrical connections to each of the p-type-doped regions 1110.

After the photovoltaic solar cell 14 is formed, it can be detached from the remainder of the SOI wafer 1100. An adhesive material 1180, such as adhesive tape, is adhered to the bottom surface of the photovoltaic solar cell 14. When the adhesive material 1180 is lifted, the photovoltaic solar cell 14 stays with the adhesive material 1180, causing the anchors 1130 that were connecting the photovoltaic solar cell 14 and the remainder of the SOI wafer 1100 to sever. If multiple cells are fabricated together, then stretching the adhesive material 1180 will sever the posts 1140 that attach the solar cells to each other, thus separating the cells from each other on the tape 1180.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A photovoltaic solar cell for generating electricity from sunlight, comprising:
    a plurality of spaced-apart point contact junctions formed in a semiconductor body to receive the sunlight and generate the electricity therefrom, the plurality of spaced-apart point contact junctions having a first plurality of regions having a first doping type and a second plurality of regions having a second doping type;
    a first electrical contact electrically connected to each of the first plurality of regions;
    a second electrical contact electrically connected to each of the second plurality of regions; and
    a passivation layer covering major surfaces and sidewalls of the photovoltaic solar cell.

2. The photovoltaic solar cell of claim 1, wherein the major surfaces of the photovoltaic solar cell are each hexagonal in shape, wherein a thickness of the photovoltaic solar cell is 5-50 μm, and wherein the passivation layer comprises silicon nitride, silicon dioxide, aluminum oxide, or a combination thereof.

3. The photovoltaic solar cell of claim 1, further comprising a plurality of severable joints extending outward from the sidewalls spaced about a periphery of the photovoltaic solar cell to connect the photovoltaic solar cell to at least one adjacent photovoltaic solar cell during fabrication of the photovoltaic solar cell and the at least one adjacent photovoltaic solar cell.

4. The photovoltaic solar cell of claim 1, further comprising a plurality of severable joints at a top surface of the major surfaces of the photovoltaic solar cell to connect the photovoltaic solar cell to a silicon-on-insulator (SOI) substrate at which the photovoltaic solar cell is fabricated.

5. The photovoltaic solar cell of claim 1, wherein the semiconductor body comprises silicon or a monocrystalline silicon layer of an SOI substrate.

* * * * *